( 12 ) United States Patent
Komaba

(10) Patent No.: US 10,051,220 B2
(45) Date of Patent: Aug. 14, 2018

(54) A/D CONVERSION CIRCUIT, AND SOLID-STATE IMAGE PICKUP APPARATUS

(71) Applicant: NIKON CORPORATION, Tokyo (JP)

(72) Inventor: Takafumi Komaba, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/735,602

(22) Filed: Jun. 10, 2015

(65) Prior Publication Data

US 2015/0288909 A1    Oct. 8, 2015

Related U.S. Application Data

(63) Continuation of application No. 14/382,126, filed as application No. PCT/JP2013/055654 on Mar. 1, 2013, now Pat. No. 9,083,892.

(30) Foreign Application Priority Data

Mar. 1, 2012    (JP) ................................. 2012-045858
Mar. 1, 2012    (JP) ................................. 2012-045859

(51) Int. Cl.
*H04N 5/335*    (2011.01)
*H04N 5/3745*    (2011.01)
(Continued)

(52) U.S. Cl.
CPC ........ *H04N 5/37455* (2013.01); *H03M 1/123* (2013.01); *H03M 1/1295* (2013.01);
(Continued)

(58) Field of Classification Search
CPC .............................. H04N 5/2355; H04N 5/347
See application file for complete search history.

(56) References Cited

U.S. PATENT DOCUMENTS 6,642,962 B1 * 11/2003 Lin ....................... G06T 3/4007
348/223.1
7,324,144 B1 * 1/2008 Koizumi ................ H04N 5/355
348/294
(Continued)

FOREIGN PATENT DOCUMENTS

JP    2007-215868 A    8/2007
JP    2008294613 A    12/2008
(Continued)

OTHER PUBLICATIONS

Apr. 2, 2013 International Search Report issued in International Application No. PCT/JP2013/055654.
(Continued)

*Primary Examiner* — Lin Ye
*Assistant Examiner* — John H Morehead, III
(74) *Attorney, Agent, or Firm* — Oliff PLC

(57) ABSTRACT

Provided is an ADC in which a plurality of pixel signals input through a vertical signal line of a solid-state image pickup apparatus are held in advance using some capacitors among a plurality of capacitors within the ADC. A potential of a node is generated by the respective pixel signals held in the capacitors. Thereafter, the potential of the node is changed by changing the voltages of counter electrodes of the capacitors, and the digital values of the pixel signals are generated by comparing the potential of the node with a predetermined potential.

36 Claims, 19 Drawing Sheets

(51) Int. Cl.
*H03M 1/56* (2006.01)
*H04N 5/378* (2011.01)
*H03M 1/12* (2006.01)
*H03M 1/14* (2006.01)
*H04N 5/262* (2006.01)
*H04N 5/361* (2011.01)
*H04N 9/04* (2006.01)

(52) U.S. Cl.
CPC ............ *H03M 1/144* (2013.01); *H03M 1/56* (2013.01); *H04N 5/2621* (2013.01); *H04N 5/361* (2013.01); *H04N 5/378* (2013.01); *H04N 9/045* (2013.01)

(56) References Cited

U.S. PATENT DOCUMENTS

| | | | |
|---|---|---|---|
| 8,085,329 B2 | 12/2011 | Kitami et al. | |
| 8,115,850 B2 | 2/2012 | Fujimura et al. | |
| 8,310,573 B2 | 11/2012 | Hirota | |
| 8,878,959 B2 | 11/2014 | Mabuchi | |
| 2007/0201738 A1* | 8/2007 | Toda | H04N 9/045 382/144 |
| 2008/0174678 A1* | 7/2008 | Solomon | G02B 27/0025 348/231.99 |
| 2008/0252742 A1* | 10/2008 | Oike | H04N 5/3741 348/222.1 |
| 2009/0128678 A1* | 5/2009 | Kitami | H04N 5/23245 348/308 |
| 2010/0033601 A1 | 2/2010 | Matsuda et al. | |
| 2010/0231768 A1 | 9/2010 | Utsunomiya et al. | |
| 2010/0238330 A1 | 9/2010 | Hirota | |
| 2011/0007193 A1 | 1/2011 | Fujimura et al. | |
| 2011/0303849 A1* | 12/2011 | Tredwell | G01T 1/2018 250/362 |
| 2012/0038808 A1* | 2/2012 | Yamanaka | H04N 5/347 348/302 |
| 2012/0057803 A1* | 3/2012 | Wakazono | G06T 5/002 382/274 |
| 2012/0274798 A1* | 11/2012 | Takahashi | H04N 9/045 348/222.1 |
| 2012/0307120 A1* | 12/2012 | Ito | H04N 5/341 348/302 |

FOREIGN PATENT DOCUMENTS

| | | |
|---|---|---|
| JP | 2009-124550 A | 6/2009 |
| JP | 2009-239398 A | 10/2009 |
| JP | 2010-239337 A | 10/2010 |
| JP | 2010-239604 A | 10/2010 |
| JP | 2011-023825 A | 2/2011 |
| WO | 2010109816 A1 | 9/2010 |

OTHER PUBLICATIONS

Apr. 2, 2013 Written Opinion issued in International Application No. PCT/JP2013/055654.
Mar. 13, 2015 Notice of Allowance issued in U.S. Appl. No. 14/382,126.
Mar. 8, 2016 Office Action issued in Japanese Patent Application No. 2012-045859.
Jun. 28, 2016 Office Action issued in Japanese Patent Application No. 2015-150142.
Jan. 31, 2017 Office Action issued in Japanese Patent Application No. 2015-150142.
Aug. 22, 2017 Office Action issued in Japanese Patent Application No. 2015-150142.

* cited by examiner

A/D CONVERSION CIRCUIT, AND SOLID-STATE IMAGE PICKUP APPARATUS

This is a Continuation of application Ser. No. 14/382,126 filed Aug. 29, 2014, which in turn is a National Phase of International Patent Application No. PCT/JP2013/055654 filed Mar. 1, 2013, which claims priority to Japanese Patent Application No. 2012-045858 filed Mar. 1, 2012 and Japanese Patent Application No. 2012-045859 filed Mar. 1, 2012. The disclosure of the prior applications are hereby incorporated by reference herein in their entireties.

TECHNICAL FIELD

The present invention relates to a solid-state image pickup apparatus.

BACKGROUND

In recent years, video cameras and electronic cameras have become widespread. As these cameras, CCD-type and CMOS-type image pickup apparatuses (solid-state image pickup apparatuses) are used. The CMOS-type image pickup apparatus refers to an apparatus that guides signal charge accumulated in a light-receiving pixel to a control electrode of a MOS transistor provided in a pixel unit and outputs an amplified signal from a main electrode.

When a dynamic range of a pixel signal is expanded in a CMOS sensor (CMOS-type solid-state image pickup apparatus), a method may be used of enlarging the dynamic range by synthesizing a central pixel and a plurality of pixels in the vicinity of the central pixel. For example, as shown in an example of image weighting of FIG. 18, a pixel R1, a pixel R2, and a pixel R3 of the same color may be weighted and added up. That is, the dynamic range of a signal with respect to a noise may be improved by weighting and adding up (adding up at a fixed ratio) the respective signals levels of a signal Sig1 output through a vertical signal line VL from the pixel R1, a signal Sig2 output through the vertical signal line VL from the pixel R2, and a signal Sig3 output through the vertical signal line VL from the pixel R3.

For example, when the signal level of the signal Sig1 output from the pixel R1 is set to Sig1, the signal level of the signal Sig2 output from the pixel R2 is set to Sig2, and the signal level of the signal Sig3 output from the pixel R3 is set to Sig3, the weighting addition is performed with "weighting addition value=Sig1+2×Sig2+Sig3" or the like.

Meanwhile, when such a weighting addition is performed, a method is used of converting the output signals Sig1, Sig2, and Sig3, which are output from the respective pixels R1, R2, and R3, to digital data (digital values) by an A/D conversion circuit (ADC) within a solid-state image pickup apparatus 1A (within a chip) or an A/D conversion circuit provided outside the apparatus and performing weighting addition using the pixel signals converted to the digital values.

This is for the purpose of temporarily converting the signals Sig1, Sig2, and Sig3 to the digital data and storing the signals in a memory or the like and then performing the weighting addition by using the digital values stored in the memory or the like, because the signals Sig1, Sig2, and Sig3 output from the vertical signal line VL are output in time series without being simultaneously output from the vertical signal line VL.

Meanwhile, there is a related solid-state image pickup apparatus (see Patent Document 1). The solid-state image pickup apparatus disclosed in Patent Document 1 is aimed at providing a solid-state image pickup apparatus including an ADC capable of being disposed in a limited space. In the solid-state image pickup apparatus, signals of pixels output through a vertical read-out line are held as potentials in a node, and a plurality of capacitors are capacitively coupled to the node holding the signals of the pixels. Voltages of counter electrodes of the plurality of capacitors are sequentially switched by controlling a transistor, thereby lowering the potential of the node in a step shape (that is, in a stepwise manner or in a slope shape). A comparator compares the potential of the node with the potentials of the pixels in a dark state, and determines a high-order bit of a digital value when the potential of the node becomes lower. Subsequently, the conversion of a low-order bit of the digital value is started.

In addition, there is a related image pickup apparatus (see Patent Document 2). The image pickup apparatus disclosed in Patent Document 2 is aimed at realizing linearity suited to characteristics of the human eye as much as possible without dynamically changing an accumulation period of a solid-state image pickup element in the image pickup apparatus, and achieving the expansion of a dynamic range. In the image pickup apparatus disclosed in Patent Document 2, a sensor chip outputs image pickup signals in parallel, which are read out from a pixel unit a plurality of times within one frame period, to an N channel within an exposure period shorter than an existing one frame period which is determined as a standard. A frame memory accumulates the image pickup signals corresponding to a plurality of frames. A frame addition circuit adds up signals of a plurality of frames read out from the frame memory to thereby create signals corresponding to a standard one frame. Thus, the dynamic range can be set to the square of N at most.

RELATED ART DOCUMENTS

Patent Documents

[Patent Document 1] Japanese Unexamined Patent Application, First Publication No. 2010-239604
[Patent Document 2] Japanese Unexamined Patent Application, First Publication No. 2009-239398

SUMMARY OF INVENTION

Problems to be Solved by the Invention

As described above, as a method of expanding a dynamic range of a pixel signal in a CMOS-type solid-state image pickup apparatus, a method is used of performing an A/D (analog/digital) conversion process on a pixel signal output from a pixel by using an A/D conversion circuit provided within the image pickup apparatus or provided outside the apparatus and then performing weighting addition by using the pixel signals converted into digital values.

FIG. 19 is a diagram showing an example of the above-described A/D conversion circuit that converts pixel signals to digital values, and is a diagram showing the configuration of an ordinary A/D conversion circuit. In the A/D conversion circuit shown in FIG. 19, a PGA (amplifier) 11 and an A/D conversion circuit (ADC) 12C have the same configuration as that of the solid-state image pickup apparatus disclosed in Patent Document 1. The circuit shown in FIG. 19 is configured such that the integral-type ADC 12C is connected to a latter part of the PGA 11, and the PGA 11 and the ADC 12C are provided for each vertical signal line VL of each column in the solid-state image pickup apparatus.

In the ADC 12C, a dark signal Vdark is initially read and is held in a capacitor C10 connected to an input terminal (−) of a comparator CP1. Then, a pixel signal is read from the PGA 11, and a voltage level of the pixel signal is held in a node Vcm. The voltage of the node Vcm is changed by changing the potential of the counter electrode of the capacitor C, and the voltage of the node Vcm is compared with the voltage (a dark potential Vdark) accumulated in the capacitor C10 by using the comparator CP1, thereby performing A/D conversion. Meanwhile, during the A/D conversion, an A/D conversion process of the pixel signal is performed at high speed by determining high-order bits (for example, high-order 3 bits) of the digital value of the pixel signal by coarse conversion and determining low-order bits (for example, low-order 12 bits) of pixel information by fine conversion (see details of Patent Document 1).

When weighting addition is performed on the output signals Sig1, Sig2, and Sig3 of the pixels R1, R2, and R3 of the same color shown in FIG. 18, a method is used of amplifying the individual signals Sig1, Sig2, and Sig3 by using a PGA, converting the amplified pixel signals to digital data (digital values) by using the ADC 12C and temporarily storing the converted data in a memory, and performing weighting addition using the digital values stored in the memory.

However, in the method of performing weighting addition by using the pixel data converted to the digital values, the addition is performed to include an error occurring when the pixel signal is amplified by the PGA or a conversion error occurring when A/D conversion is performed on an image signal, as it is. For example, an error caused by noise and a response lag which occur at the time of amplifying the pixel signal by the PGA, and a conversion error and a quantization error which are caused by noise (for example, noise occurring due to a transfer switch) which occurs within the ADC 12C are added up as is during the weighting addition. For this reason, it is desired to provide a method capable of performing weighting addition on the pixel signals without including an error occurring when the pixel signals are amplified by the PGA or a conversion error and a quantization error which occur at the time of converting the pixel signals to digital values (digital data).

An object according to an aspect of the present invention is to provide, when weighting addition is performed on a plurality of pixel signals output through a vertical signal line of the solid-state image pickup apparatus, an A/D conversion circuit and a solid-state image pickup apparatus including the A/D conversion circuit which are capable of performing the weighting addition without including a conversion error (a conversion error and a quantization error caused by noise components) which occurs at the time of performing A/D conversion.

In addition, an object of another aspect of the present invention is to provide, when weighting addition is performed on a plurality of pixel signals output from a vertical signal line of a solid-state image pickup apparatus, a solid-state image pickup apparatus which is capable of performing the weighting addition without including an error (error caused by noise and a response lag) which occurs at the time of amplifying the pixel signals by an amplifier and an error (a conversion error and a quantization error caused by noise) which occurs at the time of performing A/D conversion on the pixel signals.

Means for Solving the Problem

An A/D conversion circuit according to an aspect of the present invention includes a plurality of capacitive elements that are capacitively coupled to a node to which a pixel signal is input through a vertical signal line of a solid-state image pickup apparatus; a pixel signal holding unit that holds in advance a plurality of pixel signals input through the vertical signal line, using some of the plurality of capacitive elements; a node potential generation unit that generates a potential of the node by synthesizing the pixel signals held in some of the capacitive elements; and a control unit that changes the potential of the node by changing voltages of counter electrodes of the plurality of capacitive elements, and generates digital values of the pixel signals by comparing the potential of the node with a predetermined potential.

A solid-state image pickup apparatus according to another aspect of the present invention includes a vertical signal line that outputs pixel signals of a selected row among a plurality of light-receiving pixels, which are disposed in a matrix, for each column; a signal synthesis unit that temporarily holds the pixel signals output from the vertical signal line in units of a predetermined number of pixel signals, and synthesizes and outputs one pixel signal from the plurality of held pixel signals; and an amplifier that amplifies the synthesized pixel signals output from the signal synthesis unit.

Advantage of the Invention

In the A/D conversion circuit according to the aspect of the present invention, a plurality of pixel signals input through a vertical signal line of a solid-state image pickup apparatus are held in advance using some of a plurality of capacitors within the A/D conversion circuit, and a potential of a node is generated by the pixel signals held in some of the capacitors. The potential of the node is changed by changing the voltage of a counter electrode of the capacitor, and the digital value of the pixel signal is generated by comparing the potential of the node with a predetermined potential. Thus, in the A/D conversion circuit according to an aspect of the present invention, when weighting addition is performed on the plurality of pixel signals input through the vertical signal line of the solid-state image pickup apparatus, it is possible to perform the weighting addition without including a conversion error (a conversion error and a quantization error due to noise components) which occurs when A/D conversion is performed.

In the solid-state image pickup apparatus according to the aspect of the present invention, a signal synthesis unit is provided between a vertical signal line of the solid-state image pickup apparatus and an amplifier that amplifies pixel signals output from the vertical signal line, the signal synthesis unit temporarily holding the plurality of pixel signals sequentially output from the vertical signal line and synthesizing one pixel signal from the plurality of held pixel signals.

Thus, when weighting addition is performed on the plurality of pixel signals output from the vertical signal line of the solid-state image pickup apparatus, it is possible to perform weighting addition without including an error (error caused by noise and a response lag) which occurs at the time of amplifying the pixel signals by an amplifier and an error (a conversion error and a quantization error due to noise) which occurs when A/D conversion is performed on the pixel signals.

DESCRIPTION OF THE EMBODIMENTS

Hereinafter, embodiments of the present invention will be described with reference to the accompanying drawings.

First Embodiment

Figure 1:
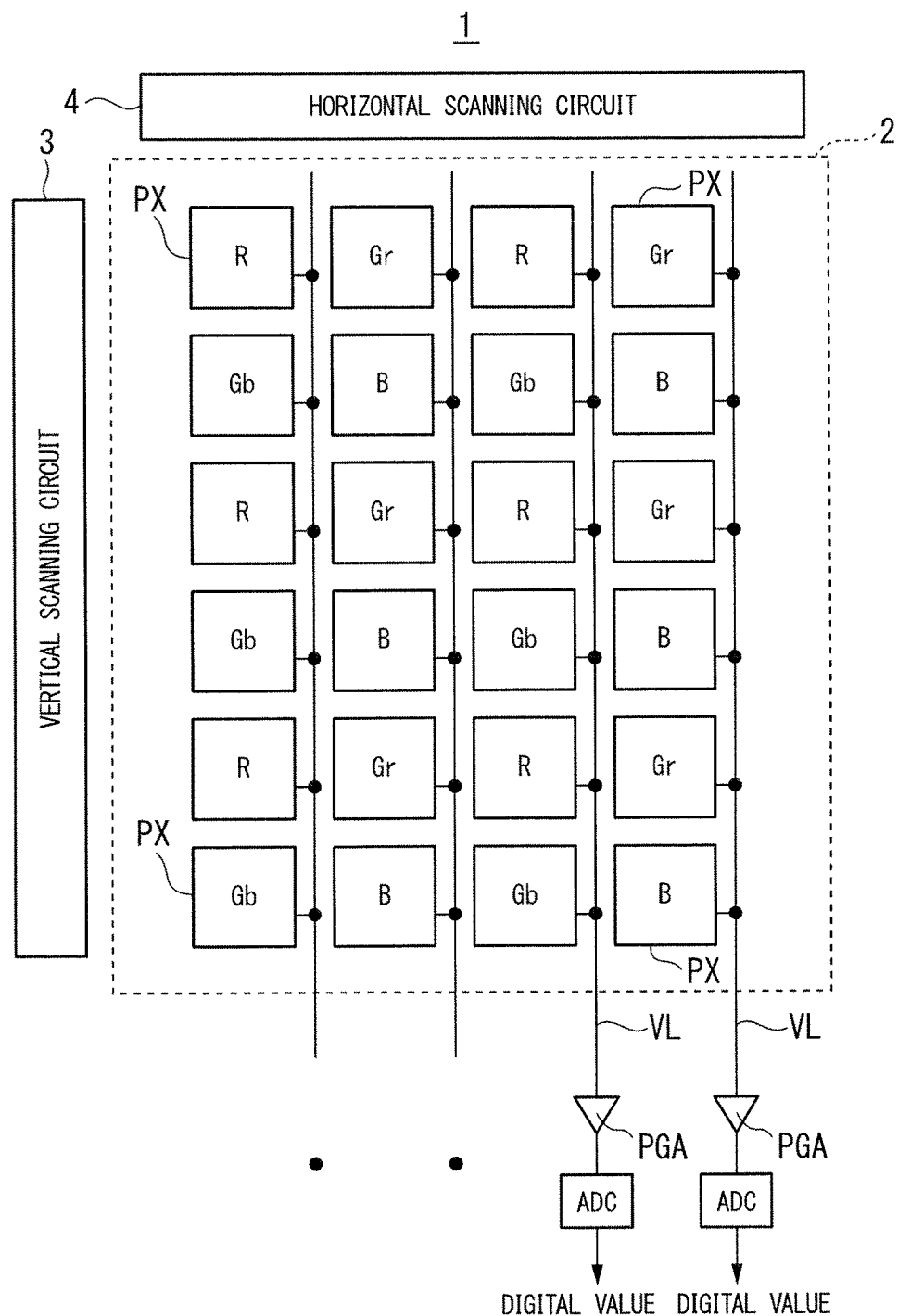
FIG. 1 is a diagram showing a solid-state image pickup apparatus.

FIG. 1 is a circuit diagram showing a CMOS-type solid-state image pickup apparatus. As shown in FIG. 1, a solid-state image pickup apparatus 1 includes a pixel unit 2 which is constituted by a plurality of pixels PX disposed two-dimensionally, a vertical scanning circuit 3, a horizontal scanning circuit 4, vertical signal lines VL which are provided corresponding to the respective columns of the pixels PX and are supplied with pixel signals of the pixels PX of the corresponding column, programmable-gain amplifiers (PGAs) connected to the respective vertical signal lines VL, and A/D conversion circuits (ADCs) that perform analog/digital (A/D) conversion on signals output from the PGAs. Meanwhile, the number of pixels PX is 6×4 (six rows and four columns) in the example shown in FIG. 1, but is not limited thereto. In FIG. 1, the pixel PX shown by sign Gr is a pixel that detects Gr (green), the pixel PX shown by sign R is a pixel that detects R (red), and the pixel PX shown by sign B is a pixel that detects B (blue). In this manner, the pixels detecting Gr (green), the pixels detecting R (red), and the pixels detecting B (blue) are alternately arranged in the pixel unit 2. Meanwhile, the configuration of the pixel PX (circuit configuration) is equivalent to the configuration shown in FIG. 2 (described later in detail).

Description of Pixel Circuit

Figure 2:
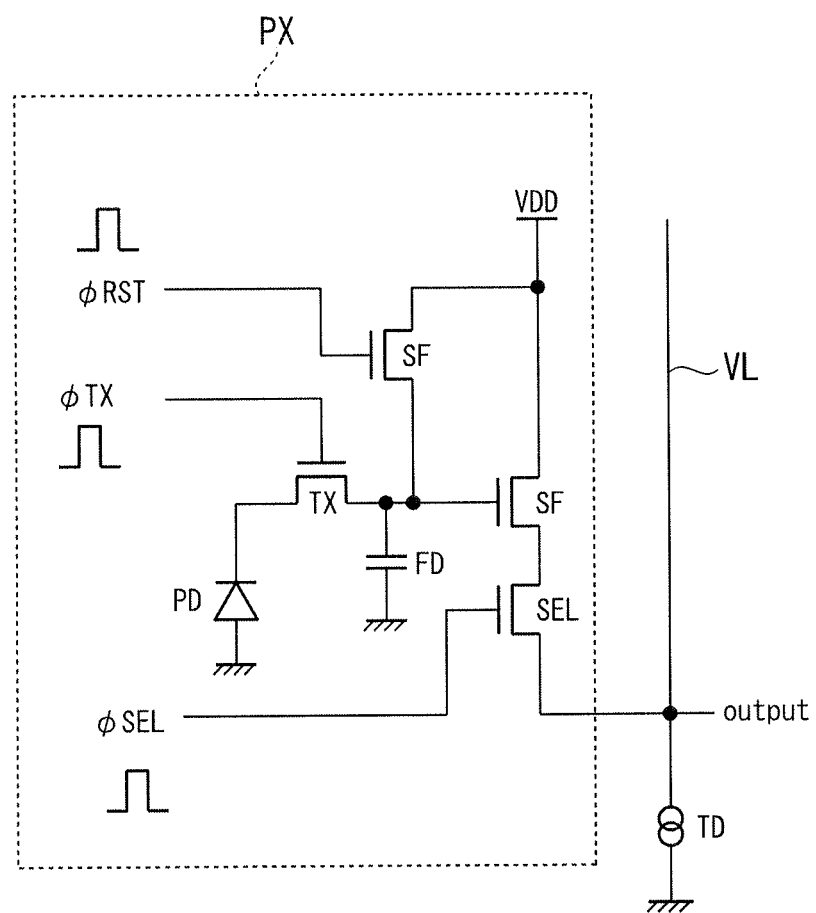
FIG. 2 is a diagram showing the configuration of a pixel circuit.

Next, the pixels PX constituting the pixel unit within the CMOS-type solid-state image pickup apparatus will be briefly described. FIG. 2 is a diagram showing the configuration of a pixel circuit, and is a circuit diagram showing one pixel PX, one vertical signal line VL, and one constant current source TD.

The pixel circuit shown in FIG. 2 includes a photodiode PD as a photoelectric conversion unit, a floating diffusion FD as an electrical charge voltage conversion unit that receives electrical charge and converts the electrical charge to a voltage, a reset transistor RST that resets a potential of the floating diffusion FD, a selection transistor SEL that supplies a signal corresponding to the potential of the floating diffusion FD to the vertical signal line VL, a transmission transistor TX as an electrical charge transmission unit that transmits electrical charge to the floating diffusion FD from the photodiode PD, and an amplification transistor SF as an amplification unit that outputs the signal corresponding to the potential of the floating diffusion FD.

In FIG. 2, VDD is a power supply potential. Meanwhile, all the transistors SF, TX, RST, and SEL of the pixel PX are nMOS transistors. A gate of the transmission transistor TX is connected in common for each row, and is supplied with a control signal φTX for controlling the transmission transistor TX from the vertical scanning circuit 3. A gate of the reset transistor RST is connected in common for each row, and is supplied with a control signal φRST for controlling the reset transistor RST from the vertical scanning circuit 3 (see FIG. 1). A gate of the selection transistor SEL is connected in common for each row, and is supplied with a control signal φSEL for controlling the selection transistor SEL from the vertical scanning circuit 3.

The photodiode PD of each pixel PX generates signal electrical charge in accordance with the amount of incident light (subject light). The transmission transistor TX of each pixel PX is turned on during a high level period of the control signal φTX and transmits electrical charge of the photodiode PD to the floating diffusion FD. The reset transistor RST is turned on during a high level period (period of the power supply potential VDD) of the control signal φRST and resets the floating diffusion FD.

In the amplification transistor SF, the drain thereof is connected to the power supply potential VDD, the gate thereof is connected to the floating diffusion FD, and the source thereof is connected to a drain of the selection transistor SEL. A source of the selection transistor SEL is connected to the vertical signal line VL. The constant current source TD applies a current to the vertical signal line VL when the selection transistor SEL of the pixel PX corresponding to the vertical signal line VL is turned on.

The amplification transistor SF of each pixel PX outputs a voltage to the vertical signal line VL through the selection transistor SEL in accordance with a voltage value of the floating diffusion FD. The selection transistor SEL is turned on during a high level period of the control signal φSEL, and connects a source of the amplification transistor SF to the vertical signal line VL.

Description of Outline of A/D Conversion Circuit of First Embodiment

Figure 3:
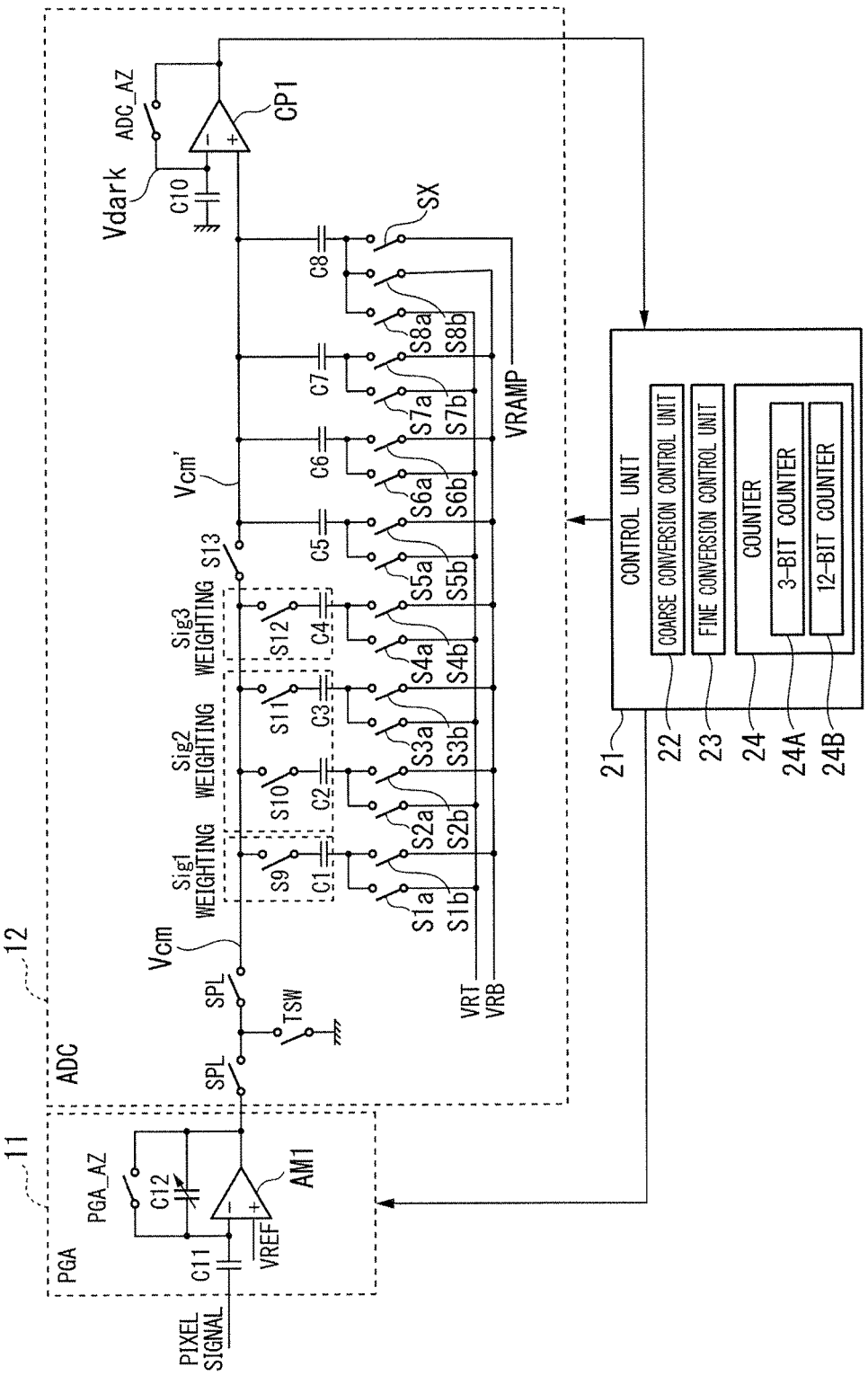
FIG. 3 is a diagram showing the configuration of an A/D conversion circuit (ADC) according to a first embodiment of the present invention.

Next, an outline of the A/D conversion circuit (ADC 12) of a first embodiment will be described. FIG. 3 is a diagram showing the configuration of an A/D conversion circuit according to the embodiment of the present invention. The circuit shown in FIG. 3 is connected to an integral-type ADC 12 of a latter part of a PGA 11. The PGA 11 and the ADC 12 are provided for each vertical signal line VL of each column in the solid-state image pickup apparatus 1 shown in FIG. 1.

Operations of the PGA 11 and the ADC 12 are controlled by a control unit 21. The control unit 21 controls the turn-on and turn-off (connection/open) (that is, switching between an electrical conduction state and a non-electrical conduction state) of switches within the PGA 11 and the ADC 12, and supplies signals (VRT, VRB, VRAMP, and the like) which are used within the ADC 12. In addition, the control unit 21 includes a coarse conversion control unit 22 controlling an operation of processing coarse conversion performed within the ADC 12 and a fine conversion control unit 23 controlling an operation of processing fine conversion.

In addition, the control unit 21 includes a counter 24 used at the time of performing coarse conversion and fine conversion processes, and a register that holds digital data obtained as a result of A/D conversion. Meanwhile, the counter 24 includes a 3-bit counter 24A for calculating the value of high-order 3 bits used for coarse conversion at the time of converting the pixel signals to digital values at resolution of 14 bits, and a 12-bit counter 24B for calculating the value of low-order 12 bits used for fine conversion (the coarse conversion and the fine conversion will be described later).

Figure 19:
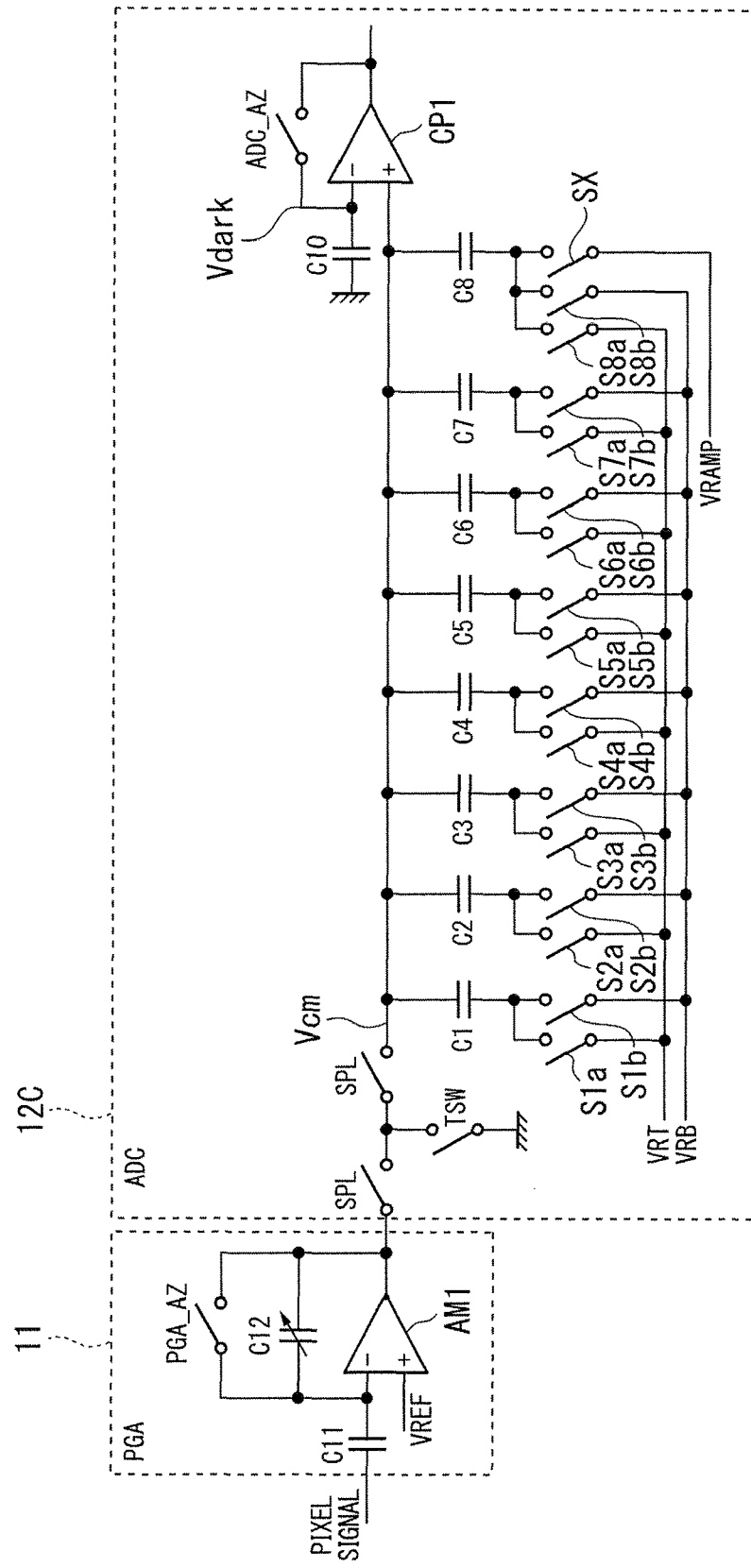
FIG. 19 is a diagram showing the configuration of an ordinary A/D conversion circuit.

The configuration of the ADC 12 shown in FIG. 3 is different from that of the ordinary ADC 12C shown in FIG. 19 in that switches S9, S10, S11, S12, and S13 are additionally added to capacitors C1 to C4. Further differences in configuration therebetween are in that the switch S13 is added to a node Vcm and in that the node Vcm and a node Vcm' can be selectively connected to each other. The other configurations are substantially the same as those of the ADC 12C shown in FIG. 19. For this reason, the corresponding components of both the ADCs are denoted by the same reference numerals and signs. Meanwhile, in a state where all the switches S9, S10, S11, S12, and S13 are set to be steadily turned on (connected) in the ADC 12 shown in FIG. 3, the ADC 12 shown in FIG. 3 can execute the same function as the ordinary ADC 12C shown in FIG. 19.

The switch S9 is a switch for holding a pixel signal Sig1 in the capacitor C1. The switches S10 and S11 are switches for holding a pixel signal Sig2 in the capacitors C2 and C3, respectively. The switch S12 is a switch for holding a pixel signal Sig3 in the capacitor C4. For example, when the switch S9 is turned on (but the switches S10, S11, S12, and S13 are turned off (opened)) in a state where the pixel signal Sig1 is input to the node Vcm, electrical charge is charged into the capacitor C1 by the pixel signal Sig1 through the switch S9, and the pixel signal Sig1 is held in the capacitor C1.

The weighting addition is performed on the signals Sig1, Sig2, and Sig3 by sequentially charging the capacitors C1, C2, C3, and C4 by the signals Sig1, Sig2, and Sig3, respectively, and simultaneously turning on the switches S9 to S12 (but turning off the switch S13), and then generating a potential on the node Vcm. The ratio between weighting values at this time is determined by the capacitance ratio between the capacitor C1, the capacitors C2 and C3, and the capacitor C4.

Here, the capacitances of the capacitors C1, C2, C3, and C4 are set to C1, C2, C3, and C4, and the voltage levels of the signals Sig1, Sig2, and Sig3 are set to Sig1, Sig2, and Sig3. Then, in this example, an electrical charge Q1 held in the capacitor C1 with respect to the signal Sig1 satisfies the relationship of $Q1=C1 \times Sig1$.

Since the capacitors C2 and C3 are connected to each other in parallel, an electrical charge Q2 held in the capacitors C2 and C3 with respect to the signal Sig2 satisfies the relationship of $Q2=(C2+C3) \times Sig2$.

An electrical charge Q3 held in the capacitor C4 with respect to the signal Sig3 satisfies the relationship of $Q3=C4 \times Sig2$.

Accordingly, a total amount Qtotal of electrical charge held in capacitors C1, C2, C3, and C4 satisfies the relationship of $Qtotal=C1 \times Sig1+(C2+C3) \times Sig2+C4 \times Sig3$.

In addition, since the capacitors C1, C2, C3, and C4 are connected to each other in parallel, a total capacitance Ctotal of the capacitors C1, C2, C3, and C4 satisfies the relationship of $Ctotal=C1+(C2+C3)+C4$.

Accordingly, when the potential of the node Vcm is represented by Vcm in a case where the switches S9, S10, S11, and S12 are simultaneously turned on and the switch S13 is turned off, the relationship of $Vcm=Qtotal/(C1+C2+C3+C4)$ is established.

Here, when the relationship of $C1=C2=C3=C4=C$ is established, the relationship of $Qtotal=C \times Sig1+2 \times C \times Sig2+C \times Sig3$ is established.

Accordingly, since the relationship of $Vcm=Qtotal/Ctotal$ is established, the relationship of $Vcm=\{C \times Sig1+2 \times C \times Sig2+C \times Sig3\}/(4 \times C)$ is established.

Therefore, the relationship of $Vcm=\{Sig1+2 \times Sig2+Sig3\}/4$ is established.

In this manner, it is possible to perform weighting addition on the signals Sig1, Sig2, and Sig3 at the ratio of "1:2:1".

As described above, in the ADC 12 shown in FIG. 3, weighting addition is performed on the pixel signals output from the PGA 11 in a state of analog signals to thereby generate a potential in the node Vcm, and A/D conversion is performed on the potential generated in the node Vcm. For this reason, when the weighting addition is performed on the pixel signals output from the PGA 11, it is possible to perform the weighting addition using the analog signals without generating a conversion error (for example, an error caused by the influence of noise and a quantization error) which occurs in the ADC 12.

In FIG. 3, since the weighting addition is performed using the capacitors C1 to C4 for coarse conversion which are provided within the ADC 12, it is possible to perform the weighting addition using the analog signals without increasing a layout area.

Meanwhile, in the above description, an example is shown in which the ratio between the weighting values is set to "1:2:1" by allocating one capacitor C1, two capacitors C2 and C3, and one capacitor C4 to three of the pixel signals Sig1, Sig2, and Sig3, respectively, but the present invention is not limited thereto. For example, the ratio between the weighting additions can be set to a desired ratio such as "1:3:1", "1:5:1", or "2:3:3" (but the number of capacitors C1 to C8 provided for coarse conversion is not limited). Further, it is also possible to perform averaging on three of the pixel signals Sig1, Sig2, and Sig3 by setting the ratio between the weighting values to "1:1:1".

In addition, the number of pixel signals to be subjected to weighting addition is not limited to three. It is also possible to perform weighting addition on five pixel signals or seven pixel signals (basically an odd number of signals) (but the number of capacitors C1 to C8 provided for coarse conversion is limited).

Description of Configuration of ADC 12 Having Weighting Addition Function

Next, the configuration of the ADC 12 shown in FIG. 3 will be described in detail. The ADC 12 is an integral-type A/D conversion circuit having a weighting addition function. The ADC 12 reads pixel signals output from the vertical signal line VL of the solid-state image pickup apparatus through the PGA 11 and performs A/D conversion on the pixel signals.

The PGA 11 includes a differential amplifier (AM1), a switch PGA_AZ, a capacitor C11, and a variable capacitor C12. A reference voltage VREF is connected to a positive (+) input of the differential amplifier AM1, and an input of the pixel signal is connected to a negative (−) input thereof through the capacitor C11. An output of the differential amplifier AM1 is connected to the variable capacitor C12 and the switch PGA_AZ for negative feedback and is connected to a switch SPL within the ADC 12. In addition, a gain of the PGA 11 can be changed by the variable capacitor C12. The gain of the PGA 11 is switched in accordance with an ISO sensitivity (for example, ISO 100 and ISO 200). Meanwhile, a maximum value of the signal output from the PGA 11 is, for example, +1 V. The numerical value is an example, and the present invention is not limited thereto.

The ADC 12 includes switches SPL and TSW. In addition, the ADC 12 includes capacitors C1 to C8, switches S1a, S1b to S8a, S8b, S9 to S13, and SX, and a comparator CP1. Meanwhile, the switches SPL and TSW and the switches S1a, S1b to S8a, S8b, S9 to S13, and SX are indicated by signs of contact-type switches, but can be actually constituted by, for example, a MOS transistor or a semiconductor switch.

The amplified pixel signal output from the PGA 11 is connected to a positive (+) input of the comparator CP1 through the switch SPL and the switch S13. In addition, an output of the comparator CP1 is connected to a negative (−) input of the comparator CP1 through the switch ADC_AZ, and the capacitor C10 holding information (dark potential Vdark) in a dark state of the pixel is connected thereto.

The capacitors C1 to C8 are capacitors having the same capacitance. The capacitors C1 to C8 are capacitively coupled to the node Vcm and the node Vcm'. In coarse conversion to be described later, the switches S1a, S1b to S8a, and S8b connected to the capacitors are sequentially switched (for example, the switch S1a is turned off, and the switch S1b is turned on). As a result, the voltages of counter electrodes of the capacitors C1 to C8 are switched between the signal VRT and the signal VRB, and it is determined which of eight ranges the potential of the node Vcm belongs to. Meanwhile, the signal VRT is a signal of, for example, +2 V, and the signal VRT is a signal of, for example, +1 V (meanwhile, the voltage of the signal VRT may be indicated by the same sign VRT, and the voltage of the signal VRB may be indicated by the same sign VRB). As will be described later, a signal (VRT−VRB) having an amplitude of 1 V (corresponding to an output voltage 1 V of the PGA 11) is generated by the signals VRT and VRB. Meanwhile, the above-described potential Vdark is substantially 0 V.

As shown in FIG. 3, one end of the capacitor C1 is connected to the node Vcm (the potential of the node Vcm may be indicated by the same sign Vcm) through the switch S9. In addition, the other end of the capacitor C1 is connected to the signal line VRT (the signal line of the signal VRT) through the switch S1a, and is also connected to the signal line VRB (the signal line of the signal VRB) through the switch S1b.

In addition, one end of the capacitor C2 is connected to the node Vcm through the switch S10. The other end of the capacitor C2 is connected to the signal line VRT through the switch S2a, and is also connected to the signal line VRB through the switch S2b.

In addition, one end of the capacitor C3 is connected to the node Vcm through the switch S11. The other end of the capacitor C3 is connected to the signal line VRT through the switch S3a, and is also connected to the signal line VRB through the switch S3b. Meanwhile, the switch S11 and the switch S10 are switches which are simultaneously turned on or off.

In addition, one end of the capacitor C4 is connected to the node Vcm through the switch S12. The other end of the capacitor C4 is connected to the signal line VRT through the switch S4a, and is also connected to the signal line VRB through the switch S4b.

In addition, one end of the capacitor C5 is connected to the node Vcm'. The other end of the capacitor C5 is connected to the signal line VRT through the switch S5a, and is also connected to the signal line VRB through the switch S5.

In addition, one end of the capacitor C6 is connected to the node Vcm'. The other end of the capacitor C6 is connected to the signal line VRT through the switch S6a, and is also connected to the signal line VRB through the switch S6b.

In addition, one end of the capacitor C7 is connected to the node Vcm'. The other end of the capacitor C7 is connected to the signal line VRT through the switch S7a, and is also connected to the signal line VRB through the switch S7b.

In addition, one end of the capacitor C8 is connected to the node Vcm'. The other end of the capacitor C8 is connected to the signal line VRT through the switch S8a, and is also connected to the signal line VRB through the switch S8b. Further, the other end of the capacitor C8 is also connected to the signal line VRAMP through the switch SX.

The node Vcm and the node Vcm' are connected to each other by the switch S13, and the node Vcm and the node Vcm' are selectively set to be in a connected state or an opened (disconnected) state through the switch S13.

The ADC 12 shown in FIG. 3 sets the switches S9 to S13 to be steadily in an ON state and thus operates as an ordinary A/D conversion circuit (the ADC 13C, shown in FIG. 19, which does not perform weighting addition), and controls the turn-on and turn-off of the switches S9 to S13 and thus operates as an A/D conversion circuit having a weighting addition function.

Description of Operation of ADC 12 in Case without Weighting Addition

Next, a description will be given of an example of a case where the ADC 12 shown in FIG. 3 operates as an ordinary A/D conversion circuit (A/D conversion circuit that does not perform weighting addition) by setting the switches S9 to S13 to be steadily in an ON state in the ADC 12 shown in FIG. 3.

Figure 4:
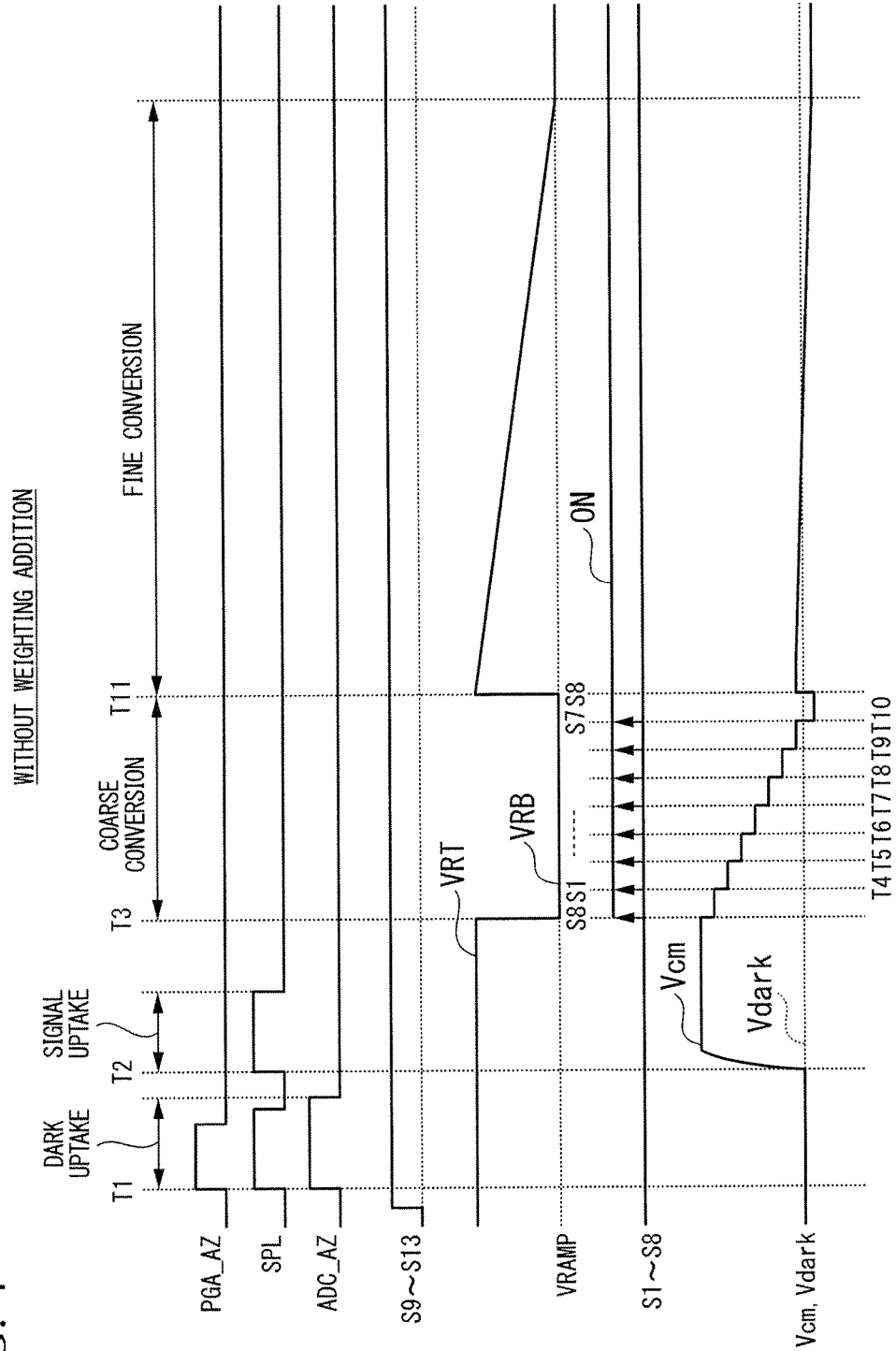
FIG. 4 is a timing diagram illustrating an operation in a case without a weighting addition operation.

FIG. 4 is a timing diagram illustrating the operation of the ADC 12 in a case where weighting addition is not performed. Meanwhile, a process shown in FIG. 4 is the same process as an ordinary integral-type A/D conversion process (A/D conversion process performed in the solid-state image pickup apparatus disclosed in Patent Document 1). Hereinafter, a flow of the process will be briefly described with reference to the timing diagram shown in FIG. 4 (see the details of the image pickup apparatus disclosed in Patent Document 1).

An A/D conversion operation in the ADC 12 is performed by a two-stage A/D conversion operation of coarse conversion and fine conversion. In addition, the switches S9 to S13 are set to be in an ON state during the operation of the A/D conversion process. In the switches S1 to S8 connected to the respective capacitors C1 to C8, initially, the switches S1a to S8a are set to be in an ON state, and the switches S1b to S8b are set to be in an OFF state.

When the A/D conversion process in the ADC 12 is started in response to a control command from the control unit 21, dark uptake is started at time T1, and the switch PGA_AZ of a PGA auto zero signal, the switch ADC_AZ of an auto zero signal, and the switch SPL of a sampling signal are turned on at time T1. Thus, the comparator CP1 holds information in a dark state of the pixel as a potential (dark potential Vdark) in a positive electrode potential of the capacitor C10. Then, when the dark uptake started from the time T1 is completed, the switch PGA_AZ, the switch ADC_AZ, and the switch SPL are turned off.

Thereafter, when the uptake of the signal uptake (reading of the pixel signal) is started at time T2 and the switch SPL is turned on again, the pixel signal output from the PGA 11 is held as a potential Vcm in the node Vcm. When the dark uptake is completed, the switch SPL is turned off.

Then, coarse conversion is started from time T3 by the coarse conversion control unit 22 within the control unit 21. At time T3, the switch S8a connected to the capacitor C8 is turned off, and the switch S8b connected to the capacitor C8 is similarly turned on. Thus, the voltage of a counter electrode of the capacitor C8, which is capacitively coupled to the node Vcm' (more exactly, the node Vcm and the node Vcm' because the switch S13 is turned on), changes from VRT (2.0 V) to VRB (1.0 V). At this time, the potential of the node Vcm is lowered by "(VRT−VRB)/8". In addition, the value of the 3-bit counter 24A for coarse conversion is set to "001".

In addition, the switch S1a connected to the capacitor C1 is turned off at time T4, and the switch S1b connected to the capacitor C1 is also turned on. Thus, the counter electrode of the capacitor C1 which is capacitively coupled to the node Vcm changes from VRT (2.0 V) to VRB (1.0 V). At this time, the potential of the node Vcm is further lowered by "(VRT−VRB)/8". In addition, the value of the 3-bit counter 24A is set to "010".

The same operation is performed at times T5 to T9. When the potential of the node Vcm is further lowered by "(VRT−VRB)/8" at time T10, the potential of the node Vcm becomes lower than a potential Vdark (approximately 0 V). At this time, high-order 3 bits of a digital value obtained by performing A/D conversion on a pixel signal is determined by the count value ("111" in this example) of the 3-bit counter 24A.

When the coarse conversion is terminated, fine conversion is started by the fine conversion control unit 23 at time T11 and after, and the determination of low-order 12 bits is started. For this reason, the switch SX is set to be in an ON state at time T11, and the signal VRAMP which is a counter electrode potential of the capacitor C8 is raised up to a level equivalent to VRT. In addition, the potential of the node Vcm is raised up to a level equivalent to a timing which is one timing earlier than a point in time when the coarse conversion is terminated. That is, the potential is raised by "(VRT−VRB)/8" (see the details of Patent Document 1).

The signal VRAMP is changed (lowered) in a slope shape at time T11 and after, and thus the potential of the node Vcm is lowered in a slope shape. The time until the point when the potential of the node Vcm becomes lower than the potential of the dark potential Vdark (approximately 0 V) is calculated using a clock signal (not shown). In addition, the calculation of the clock signal is performed by a 12-bit counter 24B. A digital value of low-order 12 bits of a pixel signal is determined by the calculated value of the 12-bit counter 24B.

In this manner, since the ADC 12 determines high-order bits (high-order 3 bits) of pixel information in coarse conversion and determines low-order bits (low-order 12 bits) of pixel information in fine conversion, it is possible to perform the A/D conversion process on the pixel signal at high speed.

Description of Operation of ADC 12 in Case where Weighting Addition is Performed Next, reference will be made to a timing diagram of FIG. 5 to describe an example of a case where the ADC 12 shown in FIG. 3 operates as an A/D conversion circuit with weighting addition.

Figure 5:
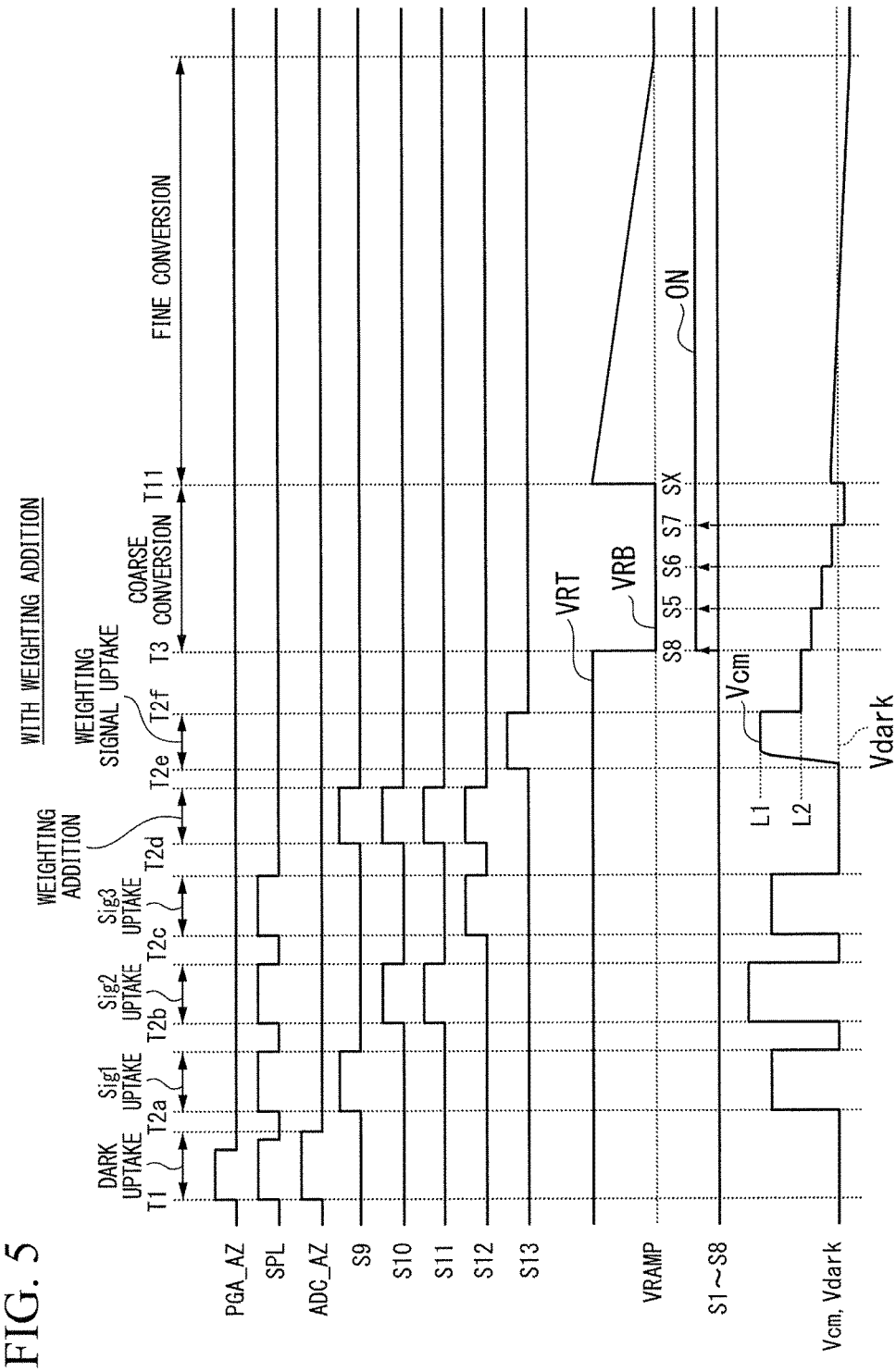
FIG. 5 is a timing diagram illustrating an operation in a case with a weighting addition operation.

The flow chart shown in FIG. 5 is different from the timing diagram shown in FIG. 4 in that processing periods of uptake of the signal Sig1 started from time T2a, uptake of the signal Sig2 started from time T2b, uptake of the signal Sig3 started from time T2c, and weighting additions of the signals Sig1, Sig2, and Sig3 started from time T2d are newly added. In addition, a difference therebetween is in that the signal uptake started at time T2 of FIG. 4 is changed to weighting signal uptake started at time T2e of FIG. 5. The other respects are the same as those of the timing diagram shown in FIG. 4.

As shown in the timing diagram of FIG. 5, dark uptake started at time T1 is terminated, and the switch S9 is turned on at time T2a. Thus, the signal Sig1 input through the PGA 11 is taken up in the capacitor C1 (the capacitor C1 is charged). In addition, the switches S10 and S11 are turned on at time T2b, and thus the signal Sig2 input through the PGA 11 is taken up in the capacitors C2 and C3 (the capacitors C2 and C3 are charged). In addition, the switch S12 is turned on at time T2c, and thus the signal Sig3 input through the PGA 11 is taken up in the capacitor C4 (the capacitor C4 is charged). Accordingly, the signals Sig1, Sig2, and Sig3 to be subjected to weighting addition being taken up in the ADC 12 is completed.

Thereafter, four of the switches S9, S10, S11, and S12 are simultaneously turned on at time T2d, and electrical charges accumulated in the capacitors C1, C2, C3, and C4 are discharged to the node Vcm. As a result, voltage signals obtained by performing weighting addition on the signals Sig1, Sig2, and Sig3 are generated on the node Vcm. Meanwhile, the ratio between the weighting values for the signals Sig1, Sig2, and Sig3 is set to "1:2:1" from the number of capacitors in which the respective signals are held.

When the voltage signals obtained by performing weighting addition on the signals Sig1, Sig2, and Sig3 are generated at time T2d, the switch S13 is further turned on at time T2e to connect the node Vcm and the node Vcm' and to take up the signals having been subjected to weighting addition on the node Vcm'.

The waveform Vcm after the time T2e indicates a voltage waveform of the node Vcm' (node Vcm' to which the capacitors C5 to C8 are connected). However, in order to describe that the electrical charges charged into the capacitors C1, C2, and C3 are redistributed between the capacitors C1 to C8 by the switch S13 being turned on from the time T2e to the time T2f, potentials (voltage level L1) for charging the capacitors C1, C2, and C3 before the switch S13 is turned on are schematically shown.

That is, at the time of connecting the node Vcm and the node Vcm' by turning on the switch S13 between the time T2e and the time T2f, the potential (voltage level L1) of the node Vcm is lowered to a voltage level L2 at time T2f by the electrical charges charged into the capacitors C1, C2, and C3 being redistributed between the capacitors C1 to C8.

Thereafter, coarse conversion is started at time T3, and fine conversion is started at time T11. The coarse conversion and the fine conversion are basically the same as those of the timing diagram shown in FIG. 4.

However, the timing diagram shown in FIG. 5 is different from the timing diagram shown in FIG. 4 in that a coarse conversion operation is performed using four of the switches S5, S6, S7, and S8. That is, in the timing diagram shown in FIG. 4, the high-order bit of the A/D conversion value is determined by performing the coarse conversion operation in eight stages using eight of the switches S1 to S8. On the other hand, in the timing diagram shown in FIG. 5, the high-order bit of the A/D conversion value is determined by performing the coarse conversion operation in four stages using four of the switches S5 to S8. This is because the switches S1 to S4 connected to the respective capacitors C1 to C4 cannot be used for coarse conversion due to the capacitors C1, C2, C3, and C4 being separated from the node Vcm' by the switch S13 being turned off during the coarse conversion operation after the time T3. Meanwhile, the switches S9 to S13 are set to be in an ON state after the time T2d, and thus it is also possible to perform the coarse conversion operation in eight stages by using eight of the switches S1 to S8.

As described above, in the A/D conversion circuit (ADC 12) of this embodiment, the weighting addition is performed on pixel signals in the vertical direction in a state of analog signals before the A/D conversion is performed, and thus it is possible to perform the weighting addition on the pixel signals without being influenced by noise components and a quantization error which are generated at the time of performing the A/D conversion.

Second Embodiment

In the ADC 12 of the first embodiment described above, an improvement in the speed of the A/D conversion is achieved by determining a high-order bit of a digital value of a pixel signal by a coarse conversion process and determining a low-order bit of a digital value of a pixel signal by a fine conversion process. However, the circuit configuration becomes complicated to that extent. In the A/D conversion circuit of the present invention, the coarse conversion process is not necessarily performed, and a configuration can also be adopted in which the coarse conversion process is not performed and only the fine conversion process is performed. Thus, it is possible to simplify the circuit configuration of the A/D conversion circuit. As a second embodiment of the present invention, an example of a case where an A/D conversion circuit performs only fine conversion will be described.

Figure 6:
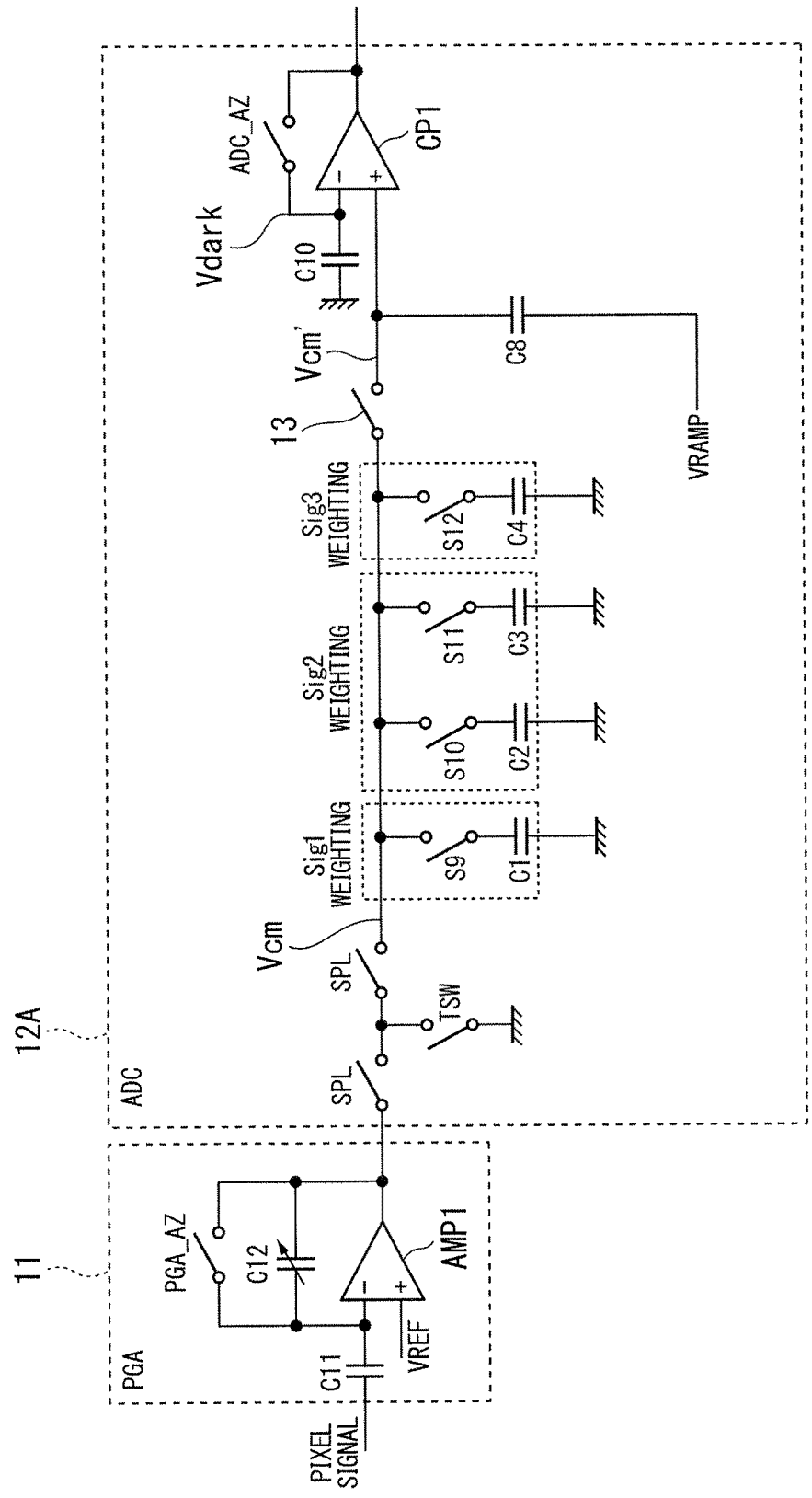
FIG. 6 is a diagram showing the configuration of an A/D conversion circuit according to a second embodiment of the present invention.

FIG. 6 is a diagram showing the configuration of the A/D conversion circuit according to the second embodiment of the present invention. An A/D conversion circuit (ADC 12A) shown in FIG. 6 is different from the A/D conversion circuit (ADC 12) shown in FIG. 3 in that the components of the ADC 12 shown in FIG. 3, which are related to a coarse conversion process, are removed. That is, the ADC 12 of FIG. 6 does not include the capacitors C5 to C7 and the switches S1a, S1b to S8a, S8b, and SX in the ADC 12 shown in FIG. 3. The other configurations are the same as those of the ADC 12 shown in FIG. 3. Therefore, in both cases, the same components are denoted by the same reference numerals and signs, and thus a repeated description thereof will be omitted here.

Figure 7:
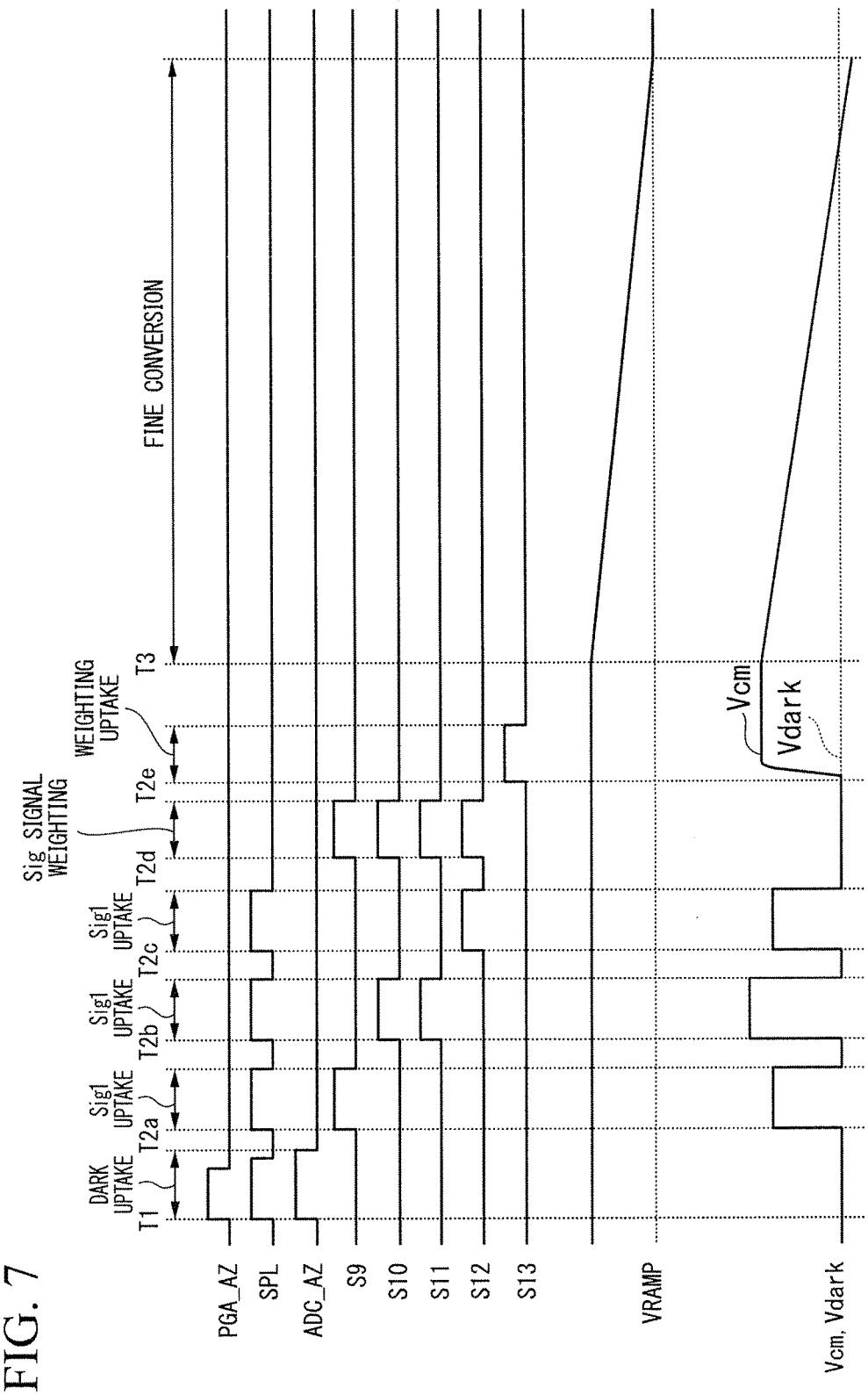
FIG. 7 is a timing diagram illustrating an operation (operation with weighting addition) of an ADC shown in FIG. 6.

FIG. 7 is a timing diagram illustrating the operation of the ADC 12A shown in FIG. 6. The timing diagram shown in FIG. 7 and the timing diagram shown in FIG. 5 with weighting addition are the same as each other in operations from dark uptake started at time T1 to uptake, which is started at time T2e, of a weighting signal into a node Vcm', and are different from each other in that a fine conversion process is started from time T3 (in the timing diagram of FIG. 5, the coarse conversion process is started from the time T3).

In this manner, after weighting addition is performed on signals Sig1, Sig2, and Sig3 by using capacitors C1, C2, C3, and C4, a coarse conversion process is omitted, and fine conversion can be started immediately. For this reason, in an A/D conversion circuit having a low number of bits (resolution), it is possible to perform weighting addition using analog signals and to simplify a circuit configuration.

Figure 8:
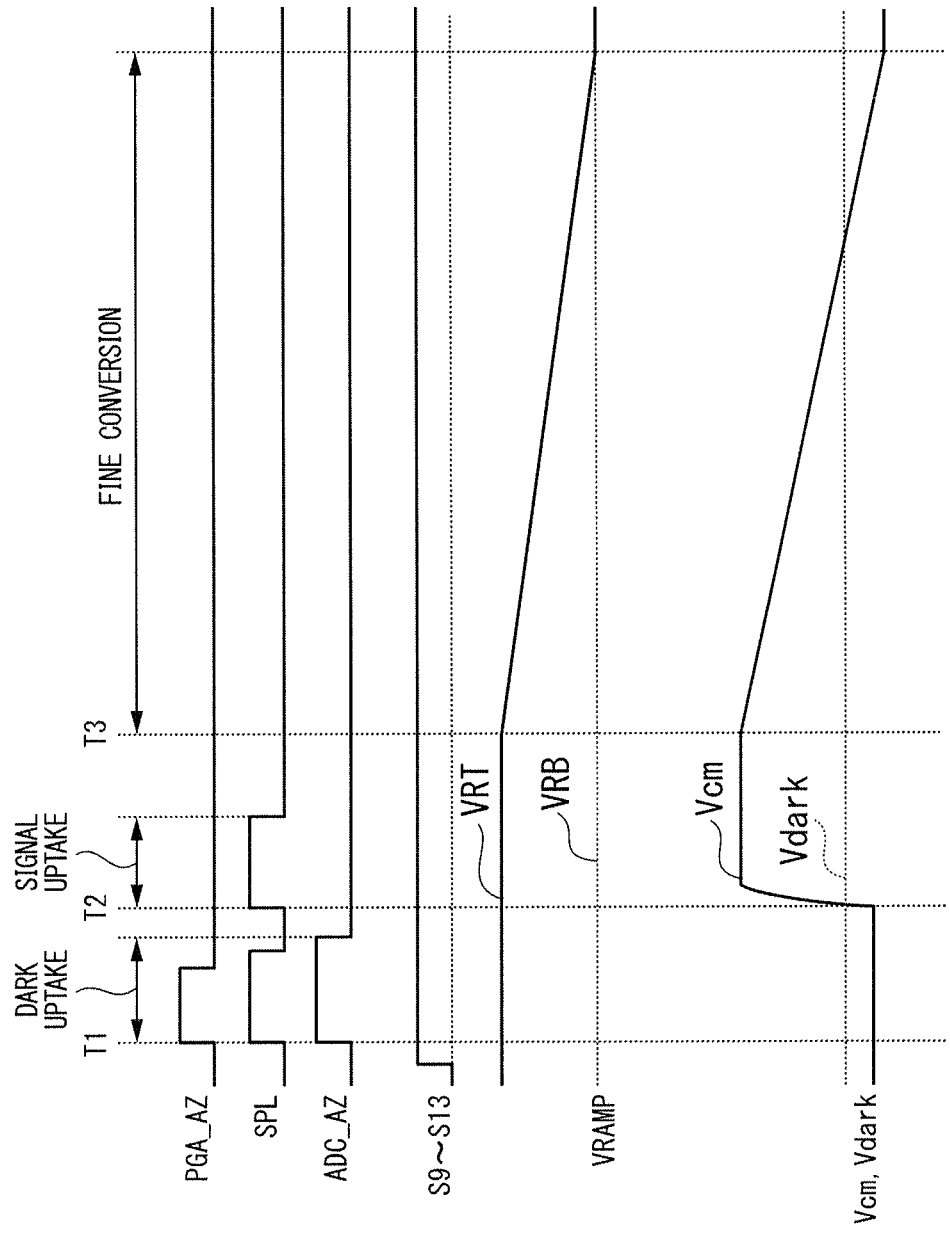
FIG. 8 is a timing diagram illustrating an operation (operation without weighting addition) of the ADC shown in FIG. 6.

Meanwhile, FIG. 8 is a timing diagram showing an operation when weighting addition is not performed in the ADC 12A shown in FIG. 7. When the weighting addition is not performed in the ADC 12A, all of switches S9 to S13 are set to be in an ON state, and dark uptake started from time T1 and signal uptake started from time T2 are completed, and then a fine conversion process is started from time T3.

Third Embodiment

In the first and second embodiments, all of the capacitors C1 to C8 connected to the node Vcm are set to have the same capacitance, and the number of capacitors holding the respective signals is allocated in accordance with the weighting values of the pixel signals Sig1, Sig2, and Sig3. For example, in the example shown in FIG. 3, one capacitor C1 is allocated to the pixel signal Sig1, two capacitors C2 and C3 are allocated to the pixel signal Sig2, and one capacitor C4 is allocated to the pixel signal Sig3. On the other hand, in a third embodiment of the present invention, one capacitor is allocated to each of pixel signals Sig1, Sig2, and Sig3, and weighting is performed by changing the capacitance of each of the capacitors.

Figure 9:
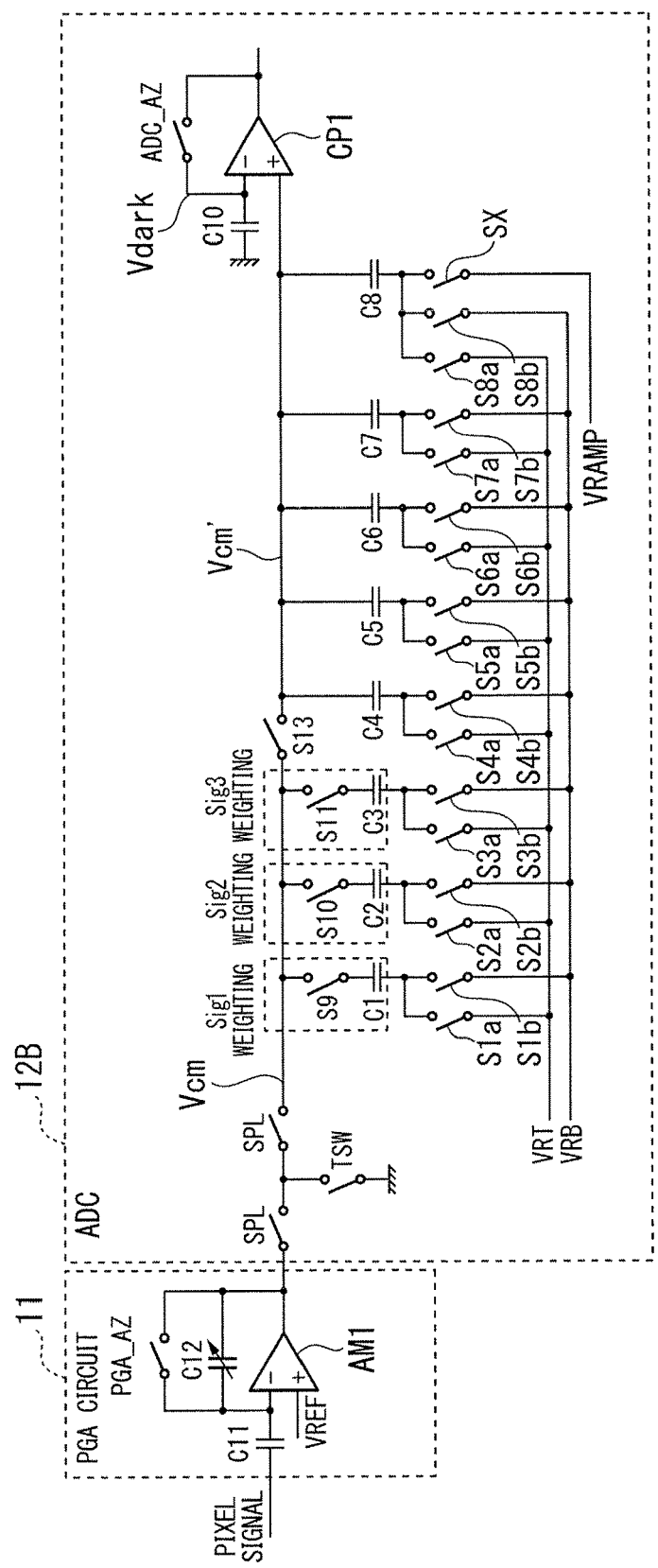
FIG. 9 is a diagram showing the configuration of an A/D conversion circuit according to a third embodiment of the present invention.

FIG. 9 is a diagram showing the configuration of an A/D conversion circuit according to the third embodiment of the present invention. An ADC 12B shown in FIG. 9 is different from the ADC 12 shown in FIG. 3 in that only one capacitor C2 is used as a capacitor holding a signal Sig2 (in the ADC 12 shown in FIG. 3, the signal Sig2 is held in two of the capacitors C2 and C3). Another difference therebetween is in that the magnitude of the capacitance of each of capacitors C1, C2, and C3 is changed in accordance with the magnitude of weighting for each of signals Sig1, Sig2, and Sig3 in the ADC 12B of FIG. 9 (that is, the magnitudes of the respective capacitances are individually set, or the magnitudes of the respective capacitances are made different from each other).

For example, the ratio between the capacitances of the capacitors C1, C2, and C3 can be set to "1:2:1". The other configurations are the same as those of the ADC 12 shown in FIG. 3. Therefore, in both cases, the same components are denoted by the same reference numerals and signs.

In the example shown in FIG. 9, the magnitudes of the respective capacitances of the capacitors C1, C2, and C3 are changed in accordance with the weighting values of the signals Sig1, Sig2, and Sig3. For this reason, the capacitances of the capacitors C1, C2, and C3 are different from the capacitances of capacitors C4 to C8. That is, the capacitors C1 to C8 includes capacitors having different capacitances (in the ADC 12 shown in FIG. 3, all the capacitances of the capacitors C1 to C8 are the same).

For this reason, the capacitors C1, C2, and C3 are used only when the weighting addition is performed on the signals Sig1, Sig2, and Sig3. After the weighting addition is performed, the switches S9, S10, and S11 are set to be in an OFF state, and the capacitors C1, C2, and C3 are made not to be used for coarse conversion which is performed in the ADC 12B. That is, in the ADC 12B, a coarse conversion process is performed using five capacitors C4, C5, C6, C7, and C8.

Figure 10:
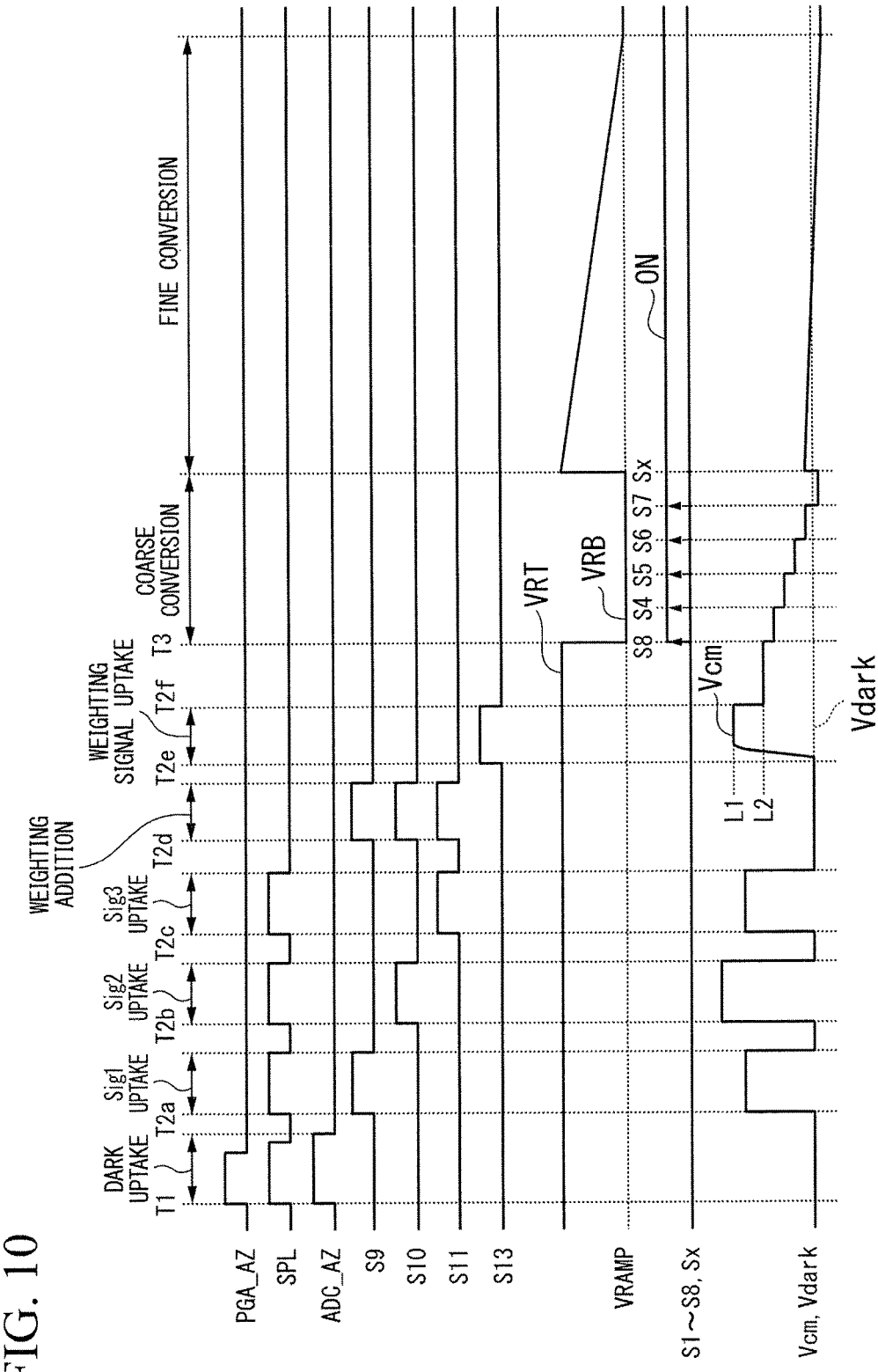
FIG. 10 is a timing diagram illustrating an operation of the ADC shown in FIG. 9.

FIG. 10 is a timing diagram illustrating the operation of the ADC 12B shown in FIG. 9, and is a timing diagram showing an operation in a case with weighting addition. The timing diagram shown in FIG. 10 and the timing diagram in the ADC 12 according to the first embodiment shown in FIG. 5 are the same as each other in operations from dark uptake started at time T1 to uptake of a signal Sig1 started at time T2a. At time T2b shown in FIG. 10, the switch S10 is turned on, and the signal Sig2 input through a PGA 11 is taken up in the capacitor C2 (the capacitor C2 is charged). In addition, the switch S11 is turned on at time T2c, and the signal Sig3 input through the PGA 11 is taken up in the capacitor C3 (the capacitor C3 is charged). Thus, the signals Sig1, Sig2, and Sig3 to be subjected to weighting addition being taken up in the ADC 12B is completed.

Thereafter, three of the switches S9, S10, and S11 are simultaneously turned on at time T2d, and electrical charges accumulated in the capacitors C1, C2, and C3 are discharged to a node Vcm. At time T2d, when voltage signals obtained by performing weighting addition on the signals Sig1, Sig2, and Sig3 are generated on the node Vcm, a switch S13 is further turned on at time T2e to connect the node Vcm and a node Vcm' and to take up the signals having been subjected to weighting addition in the node Vcm'. Thus, the voltage signals obtained by performing weighting addition on the signals Sig1, Sig2, and Sig3 are generated in the node Vcm'.

Then, coarse conversion is started at time T3. The timing diagram shown in FIG. 10 is different from the timing diagram shown in FIG. 5 in that a high-order bit of an A/D conversion value is determined by performing a coarse conversion operation using the five switches S4, S5, S6, S7, and S8. That is, in the timing diagram shown in FIG. 5, the high-order bit of the A/D conversion value is determined by performing the coarse conversion operation in four stages using four of the switches S5 to S8. On the other hand, in the timing diagram shown in FIG. 10, the high-order bit of the A/D conversion value is determined by performing the coarse conversion operation in five stages using five of the switches S4 to S8. This is because the switches S1, S2, S3 connected to the respective capacitors C1, C2, and C3 cannot be used for a coarse conversion operation due to the capacitors C1, C2, and C3 being separated from the node Vcm' by the switch S13 being turned off during the coarse conversion operation after the time T3, whereby the coarse conversion is performed using the remaining switches S4 to S8. When the coarse conversion is terminated, a fine conversion process is started at time T9. The fine conversion process can be performed in the same manner as that shown in FIGS. 4 and 5.

As described above, in the third embodiment, it is possible to finely set weighting for the signals Sig1, Sig2, and Sig3 by changing the capacitances of the capacitors C1, C2, and C3.

Here, a correspondence relation between the present invention and the embodiments will be supportively described. A solid-state image pickup apparatus according to an aspect of the present invention corresponds to the solid-state image pickup apparatus 1 shown in FIG. 1, and an A/D conversion circuit according to an aspect of the present invention corresponds to the ADC 12 shown in FIG. 3, and the like. In addition, pixel signals according to an aspect of the present invention correspond to the pixel signals (for example, signals Sig1, Sig2, and Sig3) which are generated in the pixel PX shown in FIG. 1 and are input to the ADC (A/D conversion circuit) through the vertical signal line VL. In addition, a node according to an aspect of the present invention corresponds to the node Vcm (may include both the node Vcm and the node Vcm'). In addition, a predetermined potential according to an aspect of the present invention corresponds to a potential (Vdark) of a pixel signal in a dark state, and more specifically, corresponds to a voltage (dark potential Vdark) which is held in the capacitor C10 connected to the comparator CP1.

In addition, a control unit according to an aspect of the present invention corresponds to the control unit 21. A coarse conversion unit according to an aspect of the present invention corresponds to the coarse conversion control unit 22. A fine conversion unit according to an aspect of the present invention corresponds to the fine conversion control unit 23. In addition, capacitors of a first group according to an aspect of the present invention correspond to the capacitors C1 to C4. Capacitors of a second group according to an aspect of the present invention correspond to the capacitors C5 to C8. Switches of a first group according to an aspect of the present invention correspond to the switches S9 to S12. A switch of a second group according to an aspect of the present invention corresponds to the switch S13.

(1) In the above-described embodiments, the ADC 12 includes the plurality of capacitors C1 to C8 that are capacitively coupled to the node Vcm to which pixel signals Sig1, Sig2, and Sig3 are input through the vertical signal line VL of the solid-state image pickup apparatus, pixel signal holding units (capacitors C1 to C4 and switches S9 to S11) which hold in advance the plurality of pixel signals Sig1, Sig2, and Sig3 input through the vertical signal line VL by some capacitors C1 to C4 among the plurality of capacitors C1 to C8, node potential generation units (capacitors C1 to C4 and switches S9 to S11) which generate a potential of the node Vcm by synthesizing the pixel signals held in some of the capacitors C1 to C4, and a control unit (control unit 21) which changes the potential of the node Vcm by changing the voltages of counter electrodes of the plurality of capacitors C1 to C8 and generates digital values of the pixel signals by comparing the potential of the node Vcm with a predetermined potential (dark potential Vdark).

In the ADC 12 having such a configuration, the plurality of pixel signals Sig1, Sig2, and Sig3 input through the vertical signal line VL of the solid-state image pickup apparatus are held in advance using some capacitors C1 to C4 among the plurality of capacitors C1 to C8 within the ADC 12. The potential of the node Vcm is generated by synthesizing the pixel signals Sig1, Sig2, and Sig3 held in the capacitors C1 to C4. Thereafter, the potential of the node Vcm is changed by changing the voltages of the counter electrodes of the capacitors C1 to C8, and the digital values of the pixel signals are generated by comparing the potential of the node Vcm with the predetermined potential (dark potential Vdark).

Thus, in the ADC 12 of this embodiment, the weighting addition is performed on the pixel signals Sig1, Sig2, and Sig3 in the vertical direction in a state of analog signals, and thus it is possible to perform the weighting addition without including an error caused by noise components superimposed at the time of A/D conversion and a quantization error. In addition, since the weighting addition is performed using the capacitors C1 to C4 within the ADC 12, a layout area of the solid-state image pickup apparatus (chip) is not increased.

(2) According to the above-described embodiments, in the ADC 12, the plurality of capacitors C1 to C8 have the same capacitance. When weighting addition is performed on the pixel signals Sig1, Sig2, and Sig3, the control unit 21 allocates one or a plurality of capacitors among the plurality of capacitors C1 to C8 in accordance with the weighting values of the pixel signals at the time of holding the pixel signals in the capacitors C1 to C4, holds the pixel signals by charging electrical charges into the allocated capacitors, performs weighting addition on the pixel signals Sig1, Sig2, and Sig3 by adding up the charged electrical charges held in the capacitors C1 to C4 after all inputs of the pixel signals to be subjected to the weighting addition are completed, and generates the potential of the node Vcm using the pixel signals having been subjected to weighting addition.

Thus, it is possible to easily perform the weighting addition on the pixel signals Sig1, Sig2, and Sig3 in a state of analog signals by using the capacitors C1 to C4 within the ADC 12. In addition, since the weighting addition is performed using the capacitors C1 to C4 within the ADC 12, the layout area is not increased.

(3) In the above-described embodiments, the control unit 21 includes the coarse conversion control unit 22 that changes the potential of the node Vcm in a step shape by sequentially switching the voltages of the counter electrodes of the plurality of capacitors C1 to C8 and determines a high-order bit having a predetermined number of bits of a digital value by comparing the potential of the node Vcm with a predetermined potential (dark potential Vdark), and the fine conversion control unit 23 that changes the potential of the node Vcm in a slope shape by changing a voltage VRAMP of a counter electrode of a predetermined capacitor C8 among the capacitors C1 to C8 in a slope shape after coarse conversion is terminated and that determines a low-order bit of a digital value by comparing the potential of the node Vcm with the predetermined potential (dark potential Vdark).

Thus, it is possible to perform the weighting addition without including an error caused by noise components superimposed at the time of A/D conversion and a quantization error. In addition, it is possible to increase the speed of A/D conversion at the time of converting the pixel signals having been subjected to weighting addition to digital values.

(4) In the above-described embodiments, the control unit 21 includes the fine conversion control unit 23 that changes the potential of the node Vcm in a slope shape by changing the voltage VRAMP of the counter electrode of the predetermined capacitor C8 among the capacitors C1 to C8 and that generates a digital value by comparing the potential of the node Vcm with a predetermined potential (Vdark).

Thus, a configuration can also be adopted in which a coarse conversion process is not performed and only a fine conversion process is performed. As a result, it is possible to simplify the circuit configuration of the A/D conversion circuit.

(5) In the above-described embodiments, the number of the plurality of capacitors C1 to C8 is n (n=8), and the number of capacitors C1 to C4, holding pixel signals in advance, of a first group is m (m=4). In addition, provided are m switches S9 to S12 of a first group which selectively connect four of the capacitors C1 to C4 of the first group and the node Vcm, and one switch S13 of a second group which collectively and selectively connects (n-m) (four) capacitors C5 to C8 of a second group, excluding the capacitors of the first group in the plurality of capacitors C1 to C8, and the node Vcm. The control unit 21 allocates one or a plurality of switches in advance among the switches S9 to S12 of the first group to pixel signals to be input, in accordance with the number of pixel signals to be subjected to weighting addition and the weighting additions of the respective pixel signals, initially turns on the switches S9 to S12 of the first group and the switch S13 of the second group at the time of weighting and adding up the pixel signals sequentially input through the vertical signal line VL, turns on the switches allocated to the pixel signals among the switches S9 to S12 of the first group whenever the pixel signal is input, turns off the switches after holding the pixel signals by charging electrical charges into the capacitors connected to the switches, collectively turns on the switches S9 to S12 of the first group after all inputs of the pixel signals Sig1, Sig2, and Sig3 to be subjected to the weighting addition are completed, performs the weighting addition on the pixel signals by adding up the charged electrical charges held in the capacitors C1 to C4 connected to the switches S9 to S12 of the first group, and generates a potential in the node Vcm using the pixel signals having been subjected to weighting addition.

Thus, it is possible to perform the weighting addition on the pixel signals Sig1, Sig2, and Sig3 in a state of analog signals, and to perform the weighting addition using the capacitors C1 to C4 within the ADC 12.

(6) In the above-described embodiments, the control unit 21 performs A/D conversion without weighting addition on the pixel signals to be input by controlling the switches S9 to S12 of the first group and the switch S13 of the second group to be in an ON state at all times.

Thus, it is possible to selectively execute A/D conversion with weighting addition and A/D conversion without weighting addition.

(7) In the above-described embodiments, the solid-state image pickup apparatus 1, which is the solid-state image pickup apparatus 1 including the ADC 12, includes an image pickup unit (pixel unit 2) in which pixels PX, each of which includes a photoelectric conversion element converting an optical signal into an electrical signal are disposed in the form of a plurality of matrices, the image pickup unit outputting signals of the pixels PX of the selected row through a plurality of vertical signal lines VL wired for the respective columns while sequentially scanning the pixels PX for each row. The ADC 12 is provided corresponding to each of the plurality of vertical signal lines VL, and converts pixel signals (for example, the signals Sig1, Sig2, and Sig3) which are output from the vertical signal line VL from analog signals to digital values.

Thus, in the solid-state image pickup apparatus 1 according to an aspect of the present invention, it is possible to perform weighting addition on the pixel signals in a state of analog signals at the time of performing the weighting addition on the pixel signals (for example, the signals Sig1, Sig2, and Sig3) which are output through the vertical signal line VL and outputting the pixel signals as digital values (digital data). For this reason, it is possible to output the digital data having been subjected to weighting addition without including an error caused by noise components superimposed at the time of performing A/D conversion on the pixel signals. In addition, since the weighting addition is performed using the capacitors C1 to C4 within the ADC 12, the layout area is not increased.

Fourth Embodiment

Next, a fourth embodiment of the present invention will be described with reference to the accompanying drawings. In the following description, the same components as those in the above-described embodiments are denoted by the same reference numerals and signs, and a description thereof will be omitted or simplified.

Figure 18:
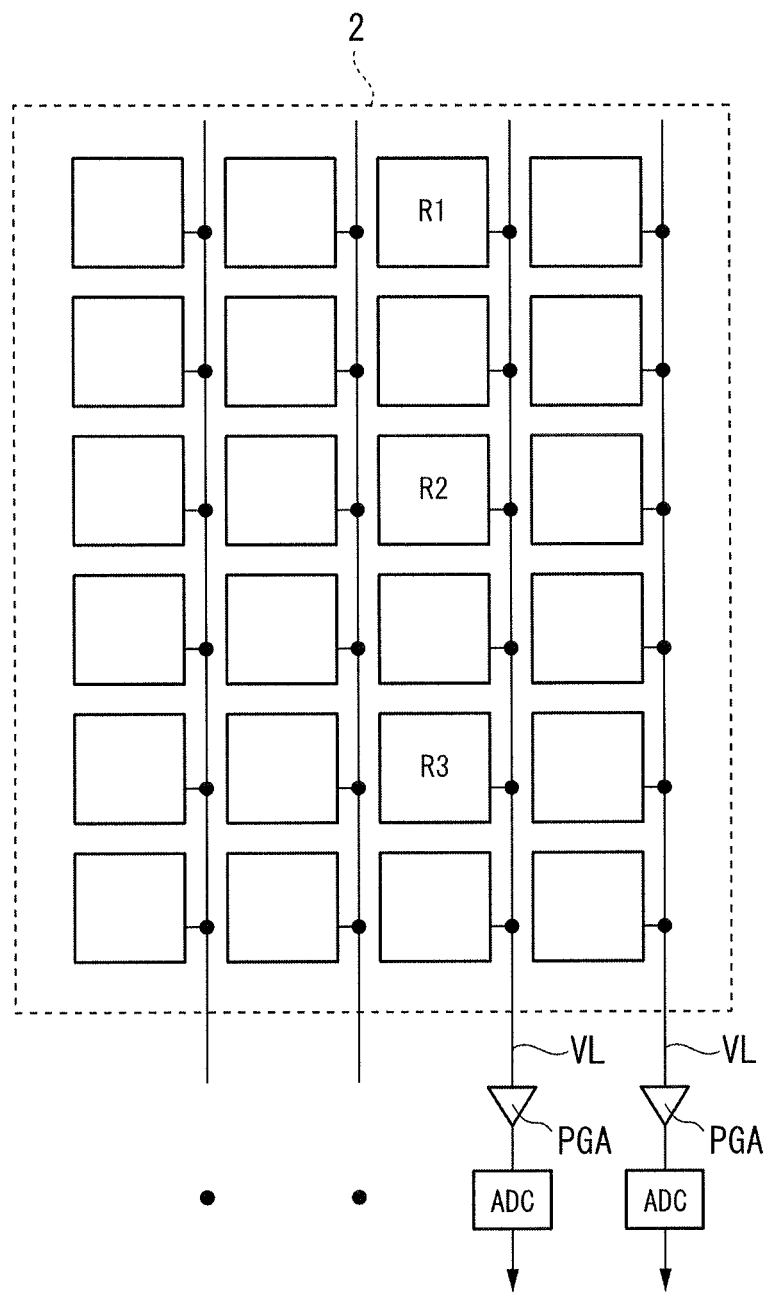
FIG. 18 is a diagram showing an example of image weighting.

Meanwhile, in the following description, the photodiode PD within the pixel R1 (see FIG. 18) may be referred to as a "photodiode PD1", the transmission transistor TX within the pixel R1 may be referred to as a "transmission transistor TX1", the floating diffusion FD within the pixel R1 may be referred to as a "floating diffusion FD1", and the amplification transistor SF within the pixel R1 may be referred to as an "amplification transistor SF1". The same is true of the pixel R2 and the pixel R3.

Description of Configuration of Solid-State Image Pickup Apparatus

Figure 11:
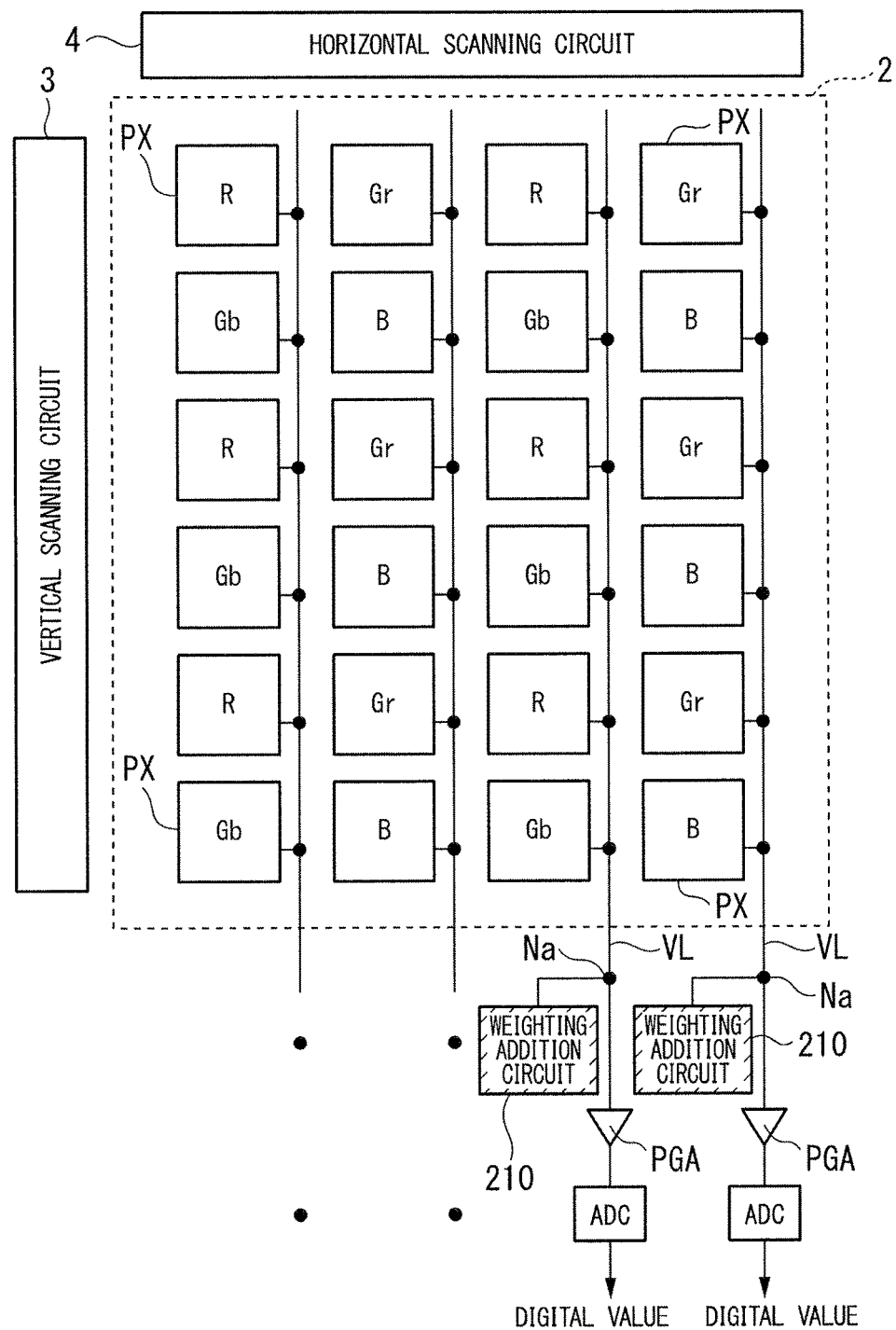
FIG. 11 is a diagram showing the configuration of a solid-state image pickup apparatus according to a fourth embodiment of the present invention.

Next, the configuration of the solid-state image pickup apparatus will be described. FIG. 11 is a diagram showing the configuration of a solid-state image pickup apparatus according to the fourth embodiment of the present invention. A solid-state image pickup apparatus 201 shown in FIG. 11 is different from the solid-state image pickup apparatus 1 shown in FIG. 1 in that a weighting addition circuit 10 is newly added to each of vertical signal lines VL. In an example, an A/D conversion circuit (ADC 212, see FIG. 12) can have the same configuration as that of the A/D conversion circuit shown in FIG. 19. Alternatively, the A/D conversion circuit (ADC 212) can have the same configuration as those of the A/D conversion circuits according to the above-described embodiments. The other configurations can be made in the same manner as those of, for example, the solid-state image pickup apparatus 1 shown in FIG. 1.

As shown in FIG. 11, a weighting addition circuit 210 is a circuit which is connected to a node Na on the signal output side of the vertical signal line VL. The weighting addition circuit holds a plurality of predetermined pixel signals (for example, output signals of the pixels R1, R2, and R3 shown in FIG. 18) which are sequentially output from the vertical signal line VL, performs weighting addition on the held pixel signals, and outputs the pixel signals having been subjected to weighting addition onto the node Na. The pixel signals having been subjected to weighting addition which are output onto the node Na from the weighting addition circuit 210 are amplified by a PGA 11 (see FIG. 12) which is a variable gain amplifier, and the pixel signals amplified by the PGA 11 are converted into digital values (digital data) by the ADC 212 (see FIG. 12).

Figure 12:
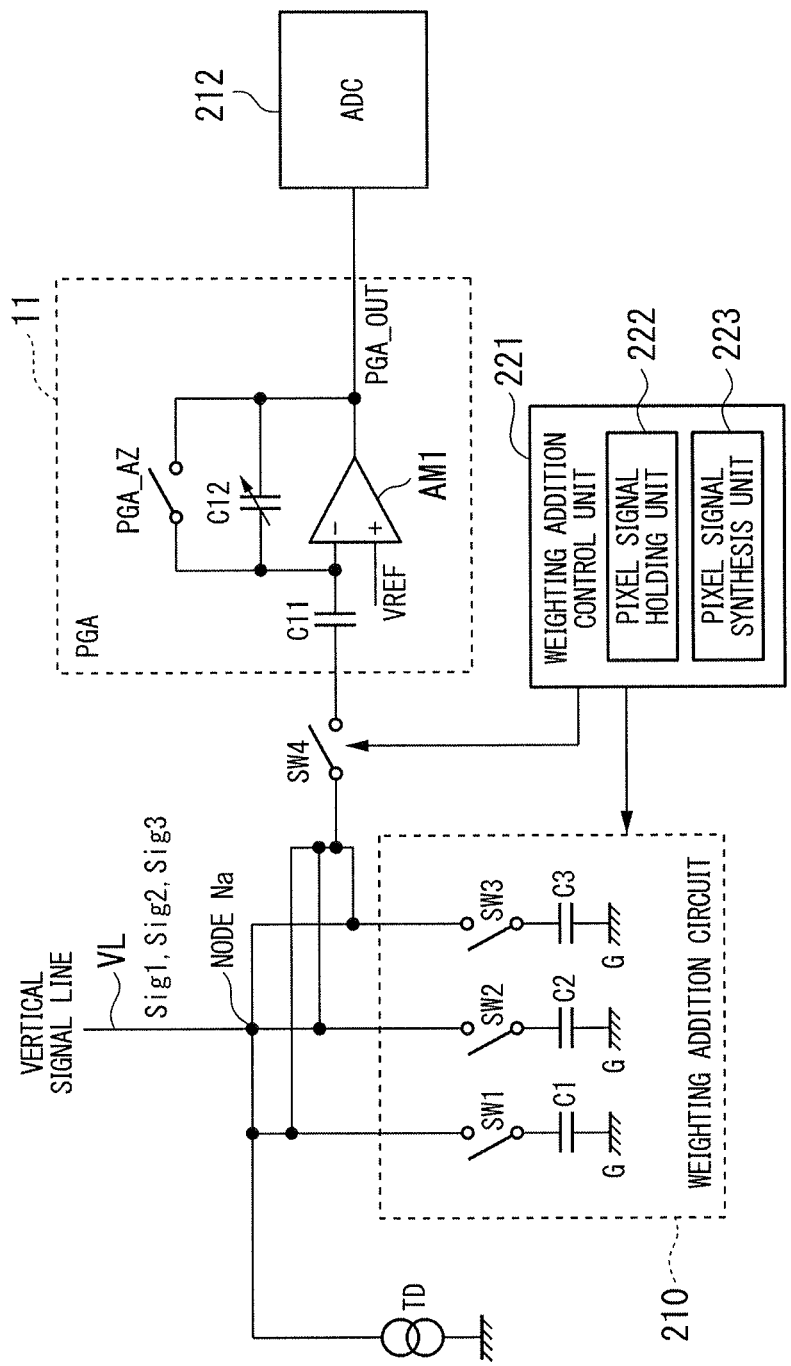
FIG. 12 is a diagram showing the configuration of a weighting addition circuit.

FIG. 12 is a diagram showing the configuration of the weighting addition circuit 210.

The weighting addition circuit 210 shown in FIG. 12 holds a plurality of pixel signals (three pixel signals Sig1, Sig2, and Sig3 in the example shown in FIG. 12) which are sequentially output from the vertical signal line VL through switches SW1, SW2, and SW3 in capacitors C1, C2, and C3, respectively, and performs weighting addition on the pixel signals Sig1, Sig2, and Sig3 held in the capacitors C1, C2, and C3. That is, voltage signals (pixel signals having been subjected to weighting addition) are generated on the node Na by adding up electrical charges held in the capacitors C1, C2, and C3 (more accurately, by redistributing electrical charges on the capacitors C1, C2, and C3). The pixel signals having been subjected to weighting addition are output to the PGA 11 through a switch SW4.

As described above, the weighting addition circuit 210 includes the capacitors C1, C2, and C3 and the switches SW1, SW2, and SW3. One end of the capacitor C1 is connected to the node Na through the switch SW1, and the other end of the capacitor C1 is connected to a circuit ground G. The switch SW1 is a switch for holding the pixel signal Sig1, which is output from the vertical signal line VL, in the capacitor C1. For example, the switch SW1 is turned on (the switches SW2, SW3, and SW4 are set to be in an OFF state) at a timing when the pixel signal Sig1 is output to the vertical signal line VL (node Na) (during an output period of the signal Sig1). As a result, electrical charge is charged into the capacitor C1 through the switch SW1, and the pixel signal Sig1 is held in the capacitor C1.

In addition, one end of the capacitor C2 is connected to the node Na through the switch SW2, and the other end of the capacitor C2 is connected to a circuit ground G. The switch SW2 is a switch for holding the pixel signal Sig2 in the capacitor C2. For example, when the switch SW2 is turned on (the switches SW1, SW3, and SW4 are set to be in an OFF state) at a timing when the pixel signal Sig2 is output to the vertical signal line VL (node Na) (during an output period of the signal Sig2), electrical charge is charged in the capacitor C2 through the switch SW2, and the pixel signal Sig2 is held in the capacitor C2.

In addition, one end of the capacitor C3 is connected to the node Na through the switch SW3, and the other end of the capacitor C3 is connected to the circuit ground G. The switch SW3 is a switch for holding the pixel signal Sig3 in the capacitor C3. For example, when the switch SW3 is turned on (the switches SW1, SW2, and SW4 are set to be in an OFF state) at a timing when the pixel signal Sig3 is output to the vertical signal line VL (node Na) (during an output period of the signal Sig3), electrical charge is charged into the capacitor C3 through the switch SW3, and the pixel signal Sig3 is held in the capacitor C3.

Meanwhile, in the circuit shown in FIG. 12, the switches SW1, SW2, SW3, and SW4 are shown by contact signs, but are actually MOS transistors, semiconductor switches, or the like. In addition, the same is true of a switch PGA_AZ and the like within the PGA 11.

In addition, the operation of the weighting addition circuit 210 is controlled by the weighting addition control unit 221. The weighting addition control unit 221 controls turn-on and turn-off of the switches SW1, SW2, and SW3 within the weighting addition circuit 210, and controls turn-on and turn-off (connection/open) (that is, switching between an electrical conduction state and a non-electrical conduction state) of the switch SW4 which is inserted between the node Na and an input terminal (−) of the PGA 11. A pixel signal holding unit 222 and a pixel signal synthesis unit 223 are provided within the weighting addition control unit 221.

The pixel signal holding unit 222 controls turn-on and turn-off of the switches SW1, SW2, and SW3 in accordance with the respective timings when the pixel signals Sig1, Sig2, and Sig3 are output onto the vertical signal line VL so that the pixel signals Sig1, Sig2, and Sig3 are held in the respective capacitors C1, C2, and C3 corresponding to the pixel signals.

In addition, the pixel signal synthesis unit 223 collectively turns on the switches SW1, SW2, and SW3 after the pixel signals Sig1, Sig2, and Sig3 are held in the corresponding capacitors C1, C2, and C3, respectively, so that the electrical charges charged into the capacitors C1, C2, and C3 are added up (more accurately, electrical charges are redistributed on the capacitors C1, C2, and C3) and the pixel signals (voltage signals) having been subjected to weighting addition are generated on the node Na. In addition, the pixel signal synthesis unit 223 turns on the switch SW4 after the pixel signals having been subjected to weighting addition are generated on the node Na, so that the pixel signals having been subjected to weighting addition are output toward the PGA 11.

Description of Operation of Weighting Addition Circuit 210

As described above, in the weighting addition circuit 210, the capacitor C1 is charged by the signal Sig1, the capacitor C2 is charged by the signal Sig2, and the capacitor C3 is charged by the signal Sig3. Then, the switches SW1, SW2, and SW3 are simultaneously turned on (the switch SW4 is turned off) so that a potential is generated on the node Na by the electrical charges charged into the capacitors C1, C2, and C3, thereby performing weighting addition on the signals Sig1, Sig2, and Sig3. In this case, the ratio between weighting values for the signals Sig1, Sig2, and Sig3 is determined by the capacitance ratio between the capacitor C1, the capacitor C2, and the capacitor C3.

In this case, an electrical charge Q1 held in the capacitor C1 by the signal Sig1 satisfies the relationship of $Q1=C1 \times Sig1$.

An electrical charge Q2 held in the capacitor C2 by the signal Sig2 satisfies the relationship of $Q2=C2 \times Sig2$.

An electrical charge Q3 held in the capacitor C3 by the signal Sig3 satisfies the relationship of $Q3=C3 \times Sig3$.

Accordingly, a total amount Qtotal of electrical charge held in capacitors C1, C2, and C3 satisfies the relationship of $Qtotal=C1 \times Sig1+C2 \times Sig2+C3 \times Sig3$.

In addition, a total capacitance Ctotal of the capacitors C1, C2, and C3 satisfies the relationship of $Ctotal=C1+C2+C3$.

Accordingly, when the potential of the node Na is represented by VNa in a case where the switches SW1, SW2, and SW3 are simultaneously turned on (the switch SW4 is turned off), the relationship of $VNa=Qtotal/(C1+C2+C3)$ is established.

Here, when the relationship of C1:C2:C3=a:b:c is established, the relationship of $Qtotal=C1 \times Sig1+(b/a) \times C1 \times Sig2+(c/a) \times C1 \times Sig3$ is established.

Accordingly, since the relationship of VNa=Qtotal/Ctotal is established, the relationship of $VNa=\{C1 \times Sig1+(b/a) \times C1 \times Sig2+(c/a) \times C1 \times Sig3\}/(C1+C2+C3)$ is established.

Further, as described above, since the relationship of C1:C2:C3=a:b:c is established, the relationship of $$VNa = \{C1 \times Sig1 + (b/a) \times C1 \times Sig2 + (c/a) \times C1 \times Sig3\}/$$
$$(C1 + (b/a)C1 + (c/a)C1)$$
$$= \{Sig1 + (b/a) \times Sig2 + (c/a) \times Sig3\}/(1 + (b/a) + (c/a)) \text{ is established.}$$

Then, for example, when the relationship of C1:C2:C3=a:b:c=1:2:1 is established, the relationship of $$VNa = (Sig1 + (2/1) \times Sig2 + (1/1) \times Sig3)/(1 + (2/1) + (1/1)),$$
$$= (Sig1 + 2 \times Sig2 + Sig3)/4 \text{ is established.}$$

That is, it is possible to perform weighting addition having the ratio of "1:2:1" on the signals Sig1, Sig2, and Sig3.

As described above, in the weighting addition circuit 10 shown in FIG. 12, weighting addition is performed on the pixel signals Sig1, Sig2, and Sig3 output from the vertical signal line VL in a state of the analog signals to thereby generate a potential (voltage signal) in the node Na, and the potential generated in the node Na is amplified by the PGA 11 and is output to the ADC 212. For this reason, when the weighting addition is performed on the pixel signals output from the vertical signal line VL, it is possible to perform the weighting addition using the analog signals without being influenced by noise occurring in the PGA 11 and a conversion error (for example, an error caused by noise occurring due to switching between the switches and a quantization error) which occurs in the ADC 212.

Meanwhile, in the above description, an example is shown in which the highest weighting is given to the central pixel signal Sig2 with respect to three of the pixel signals Sig1, Sig2, and Sig3 to be subjected to weighting (the highest weighing is normally given to the central pixel signal Sig2), but the present invention is not particularly limited thereto. The highest weighting may be given to the pixel signal Sig1 or the pixel signal Sig3.

In addition, the number of pixel signals to be subjected to weighting addition is not limited to three. It is also possible to perform weighting addition on five pixel signals or seven pixel signals (basically an odd number of signals). Meanwhile, weighting addition is basically performed on an odd number of pixel signals, but may also be performed on an even number of pixel signals.

In addition, the ratio between the capacitances of the capacitors C1, C2, and C3 is set to "C1:C2:C3=1:1:1", and thus it is also possible to perform averaging between the pixel signals Sig1, Sig2, and Sig3. Further, the switches SW1, SW2, and SW3 are set to be steadily in an OFF state, and thus it is also possible to cause the solid-state image pickup apparatus 201 to operate as an ordinary circuit (see FIG. 14 to be described later) without weighting addition.

Description of Operation Timing of Weighting Addition Circuit 210

Figure 13:
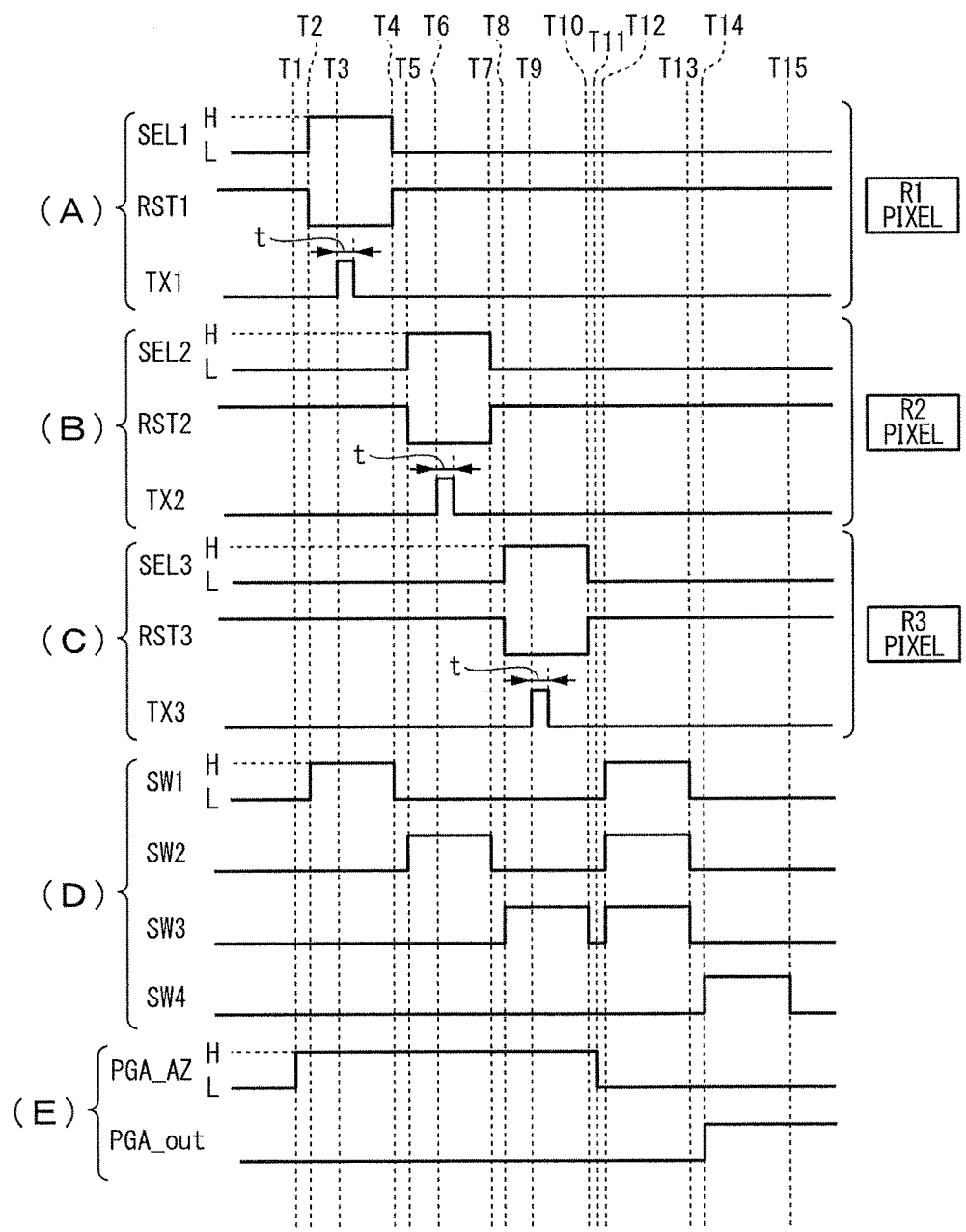
FIG. 13 is a timing diagram illustrating an operation (with weighting addition) of a weighting addition circuit.

FIG. 13 is a timing diagram illustrating the operation of the weighting addition circuit 210. In the timing diagram shown in FIG. 13, FIG. 13(A) shows ON and OFF states (ON in an H state) of a selection transistor SEL1, a reset transistor RST1, and a transmission transistor TX1 within a red pixel R1 (see FIG. 18). In addition, FIG. 13(B) shows ON and OFF states (ON in an H state) of a selection transistor SEL2, a reset transistor RST2, and a transmission transistor TX2 within a red pixel R2 (see FIG. 18), and FIG. 13(C) shows ON and OFF states (ON in an H state) of a selection transistor SEL3, a reset transistor RST3, and a transmission transistor TX3 within a red pixel R3 (see FIG. 18).

In addition, FIG. 13(D) shows ON and OFF states (ON in an H state) of the switches SW1, SW2, and SW3 within the weighting addition circuit 210 and ON and OFF states (ON in an H state) of the switch SW4. In addition, FIG. 13(E) shows ON and OFF states (ON in an H state) of the switch PGA_AZ within the PGA 11 and an output signal PGA_out of the PGA 11.

Hereinafter, a flow of the operation in the weighting addition circuit 210 will be described with reference to FIG. 13.

First, it is assumed that all the transistors (SEL, RST, and TX) shown in FIGS. 13(A) to 13(C) are initially turned off before time T1 and all the switches SW1, SW2, SW3, and SW4 shown in FIG. 13(D) are turned off. In addition, as shown in FIG. 13(E), it is assumed that the switch PGA_AZ within the PGA 11 is turned off. Meanwhile, since the switch SW4 is turned off in a state before the time T1, the signal PGA_out is not output from the PGA 11.

Then, a weighting addition process for the pixel signals Sig1, Sig2, and Sig3 is started from the time T1. In addition, at the time of starting the weighting addition process, a signal amplification operation in the PGA 11 is stopped by turning off the switch SW4 and turning on the switch PGA_AZ within the PGA 11 (by setting an amplification gain to "0").

Then, a holding operation of the pixel signal Sig1 of the pixel R1 in the capacitor C1 (charging operation of the capacitor C1) is started at time T2. In this case, as shown in FIG. 13(A), the selection transistor SEL1 is turned on and the reset transistor RST1 is turned off within the pixel R1 at time T1, and this state is continued until time T4. In addition, as shown in FIG. 13(D), the switch SW1 connected to the capacitor C1 within the weighting addition circuit 210 is turned on by the pixel signal holding unit 222 at time T1, and this state is continued until the time T4.

Then, as shown in FIG. 13(A), the transmission transistor TX1 within the pixel R1 is turned on during a period t at time T3 between the time T1 and the time T4. Thus, a voltage signal is generated by electrical charge, which is detected by a photodiode PD1, being transmitted to the floating diffusion FD1 through the transmission transistor TX1, and a signal obtained by amplifying the voltage signal using the amplification transistor SF1 is output to the vertical signal line VL through the selection transistor SEL1. The capacitor C1 is charged through the switch SW1 by the signal (pixel signal Sig1) which is output from the vertical signal line VL.

Then, as shown in FIG. 13(A), the selection transistor SEL1 is turned off and the reset transistor RST1 is turned on at time T4 in the pixel R1, and thus the output of the pixel signal Sig1 to the vertical signal line VL is stopped. In the pixel signal holding unit 222, the switch SW1 is turned off at time T4, and thus the holding of the pixel signal Sig1 through the capacitor C1 is completed.

Subsequently, a holding operation of the pixel signal Sig2 of the pixel R2 in the capacitor C2 (charging operation of the capacitor C2) is started at time T5. In this case, as shown in FIG. 13(B), the selection transistor SEL2 is turned on and the reset transistor RST2 is turned off within the pixel R2 at time T5, and this state is continued until time T7. In addition, as shown in FIG. 13(D), the switch SW2 connected to the capacitor C2 within the weighting addition circuit 210 is turned on by the pixel signal holding unit 222 at time T5, and this state is continued until the time T7.

Then, as shown in FIG. 13(B), the transmission transistor TX2 within the pixel R2 is turned on during a period t at time T6 between the time T5 and the time T7. Thus, a voltage signal is generated by electrical charge, which is detected by a photodiode PD2 within the pixel R2, being transmitted to a floating diffusion FD2 through the transmission transistor TX2, and a signal obtained by amplifying the voltage signal using the amplification transistor SF2 is output to the vertical signal line VL through the selection transistor SEL2. The capacitor C2 is charged through the switch SW2 by the signal (pixel signal Sig2) which is output from the vertical signal line VL.

Then, as shown in FIG. 13(B), the selection transistor SEL2 is turned off and the reset transistor RST2 is turned on at time T7 in the pixel R2, and thus the output of the pixel signal Sig2 to the vertical signal line VL is stopped. In the pixel signal holding unit 222, the switch SW2 is turned off at time T7, and thus the holding of the pixel signal Sig2 through the capacitor C2 is completed.

Subsequently, a holding operation of the pixel signal Sig3 of the pixel R3 in the capacitor C3 (charging operation of the capacitor C3) is started at time T8. In this case, as shown in FIG. 13(C), the selection transistor SEL3 is turned on and the reset transistor RST3 is turned off within the pixel R3 at time T8, and this state is continued until time T10. In addition, as shown in FIG. 13(D), the switch SW3 connected to the capacitor C3 within the weighting addition circuit 210 is turned on by the pixel signal holding unit 222 at time T8, and this state is continued until the time T10.

Then, as shown in FIG. 13(C), the transmission transistor TX3 within the pixel R3 is turned on during a period t at time T9 between the time T8 and the time T10. Thus, a voltage signal is generated by electrical charge, which is detected by a photodiode PD3 within the pixel R3, being transmitted to a floating diffusion FD3 through the transmission transistor TX3, and a signal obtained by amplifying the voltage signal using the amplification transistor SF3 is output to the vertical signal line VL through the selection transistor SEL3. The capacitor C3 is charged through the switch SW3 by the signal (pixel signal Sig3) which is output from the vertical signal line VL.

Then, as shown in FIG. 13(C), the selection transistor SEL3 is turned off and the reset transistor RST3 is turned on at time T10 in the pixel R3, and thus the output of the pixel signal Sig3 to the vertical signal line VL is stopped. In the pixel signal holding unit 222, the switch SW3 is turned off at time T10, and thus the holding of the pixel signal Sig3 through the capacitor C3 is completed.

After the holding of the pixel signals Sig1, Sig2, and Sig3 in the capacitors C1, C2, and C3 is completed at time T10, the switch PGA_AZ within the PGA 11 is turned off at time T11 as shown in FIG. 13(E), and thus an amplification operation of the pixel signals in the PGA 11 is started after the time T11.

Then, weighting addition is started at time T12. That is, as shown in FIG. 13(D), the switches SW1, SW2, and SW3 are simultaneously turned on by the pixel signal synthesis unit 223 at time T12, and this state is continued until time T13. Thus, the electrical charges charged into the capacitors C1, C2, and C3 are added up, and the voltage signals (pixel signals), which have been subjected to the weighting addition using the electrical charges, are generated on the node Na.

Thereafter, as shown in FIG. 13(D), the switch SW4 is turned on by the pixel signal synthesis unit 223 at time T14, and the ON state of the switch SW4 is continued until time T15. Thus, the voltage signals (pixel signals having been subjected to weighting addition) which are generated on the node Na are output toward the PGA 11.

For this reason, as shown in FIG. 13(D), the signal PGA_out (signal obtained by amplifying the pixel signal having been subjected to weighting addition) is output from the PGA 11 after the time T14. The signal PGA_out output from the PGA 11 is input to the ADC 212 (see FIG. 19), and thus the signal level thereof is held in the node Vcm within the ADC 212, and the A/D conversion is performed on the signal held in the node Vcm.

Figure 14:
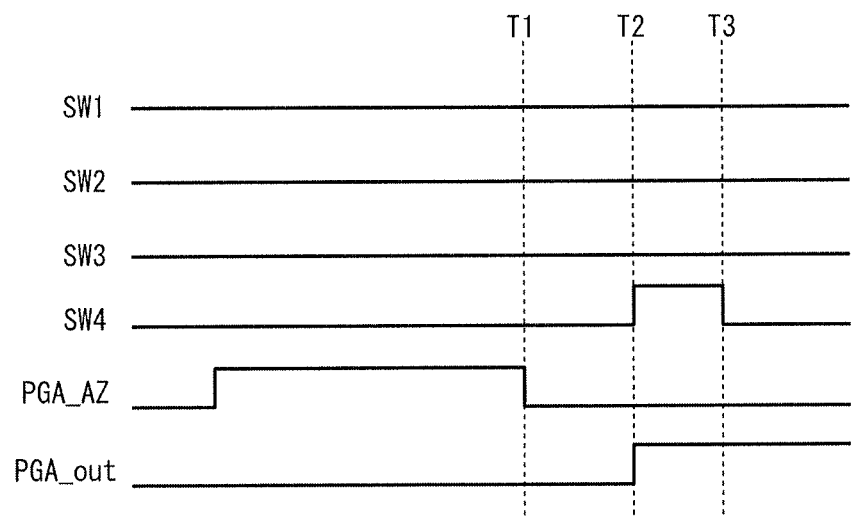
FIG. 14 is a timing diagram illustrating an operation (without weighting addition) of a weighting addition circuit.

In addition, FIG. 14 is a timing diagram illustrating an operation in a case without weighting addition. As described above, it is also possible to cause the weighting addition circuit 210 to operate as a circuit without weighting addition. When the weighting addition circuit 210 operates as a circuit without weighting addition, the pixel signal holding unit 222 sets the switches SW1, SW2, and SW3 connected to the respective capacitors C1, C2, and C3 to be in an OFF state at all times as shown in FIG. 14.

Then, the switch PGA_AZ within the PGA 11 is turned off at time T1, and an amplification operation of the pixel signal in the PGA 11 is started after the time T1. The pixel signal holding unit 222 turns on the switch SW4 during a period from the time T2 to the time T3 so that the pixel signal (not shown) output from the vertical signal line VL is input to the PGA 11 and the signal PGA_out obtained by amplifying the pixel signal is output from the PGA 11.

In this manner, it is also possible to cause the weighting addition circuit 210 to operate as a circuit without weighting addition.

Fifth Embodiment

In the weighting addition circuit 210 according to the fourth embodiment described above, the respective capacitances of the capacitors C1, C2, and C3 are set to different values in accordance with the ratio between weighting values in order to perform weighting addition on the signals Sig1, Sig2, and Sig3. On the other hand, as a fifth embodiment of the present invention, a description will be given of an example in which weighting addition is performed using capacitors having the same capacitance.

Figure 15A:
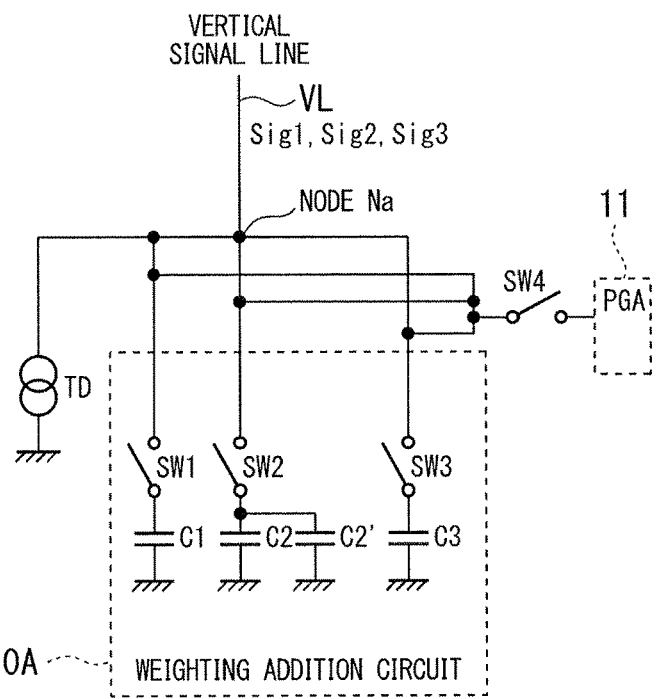
FIG. 15A is a diagram showing an example of the configuration of a solid-state image pickup apparatus according to a fifth embodiment of the present invention.
Figure 15B:
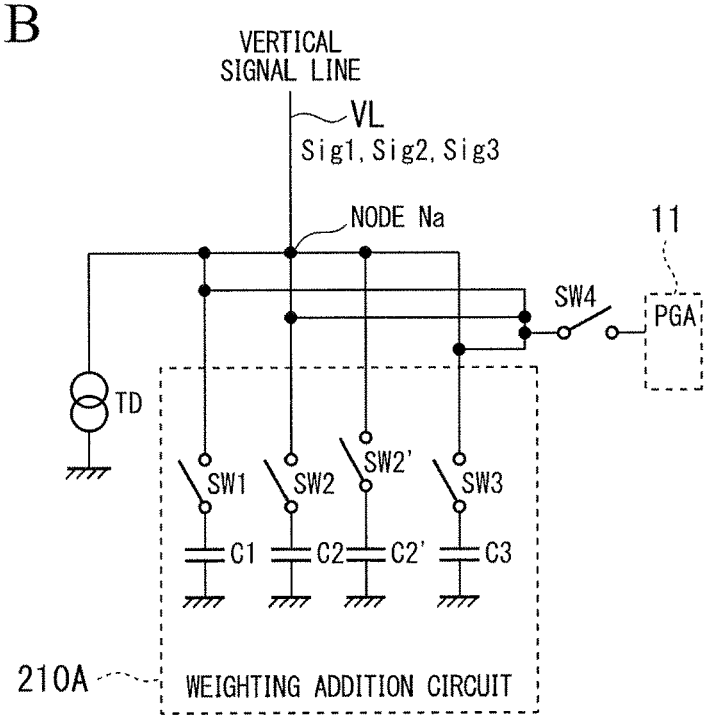
FIG. 15B is a diagram showing another example of the configuration of the solid-state image pickup apparatus according to the fifth embodiment of the present invention.

FIGS. 15A and 15B are diagrams showing the configuration of a weighting addition circuit 210A according to the fifth embodiment of the present invention. The weighting addition circuit 210A shown in FIG. 15A is different from the weighting addition circuit 210 shown in FIG. 12 in that capacitances of capacitors C1, C2, C2', and C3 are set to the same value and two capacitors C2 and C2' are connected to a switch SW2 in parallel. The other configurations are the same as those of the weighting addition circuit 210 shown in FIG. 12. For this reason, the corresponding components are denoted by the same reference numerals and signs, and thus a repeated description will be omitted here.

In this manner, two of the capacitors C2 and C2' having the same capacitance are connected to each other in parallel, and thus it is possible to set the ratio between weighting values for pixel signals Sig1, Sig2, and Sig3 to "1:2:1" by using the capacitors C1, C2, C2', and C3 having the same capacitance.

In addition, capacitor elements having the same capacitance may be formed without forming capacitor elements having different capacitances on a solid-state image pickup apparatus (chip), and thus it is also possible to simplify a manufacturing process of the solid-state image pickup apparatus.

FIG. 15A shows an example in which two of the capacitors C2 and C2' are connected to one switch SW2 in parallel. For example, as shown in FIG. 15B, two of the capacitors C2 and C2' may be formed independently, and may be connected to a node Na using two switches SW2 and SW2', respectively. When weighting addition is performed, two of the switches SW2 and SW2' are simultaneously turned on and turned off.

In this manner, it is also possible to set the ratio between weighting values for the pixel signals Sig1, Sig2, and Sig3 to "1:2:1" by using the capacitors C1, C2, C2', and C3 having the same capacitance.

Figure 16A:
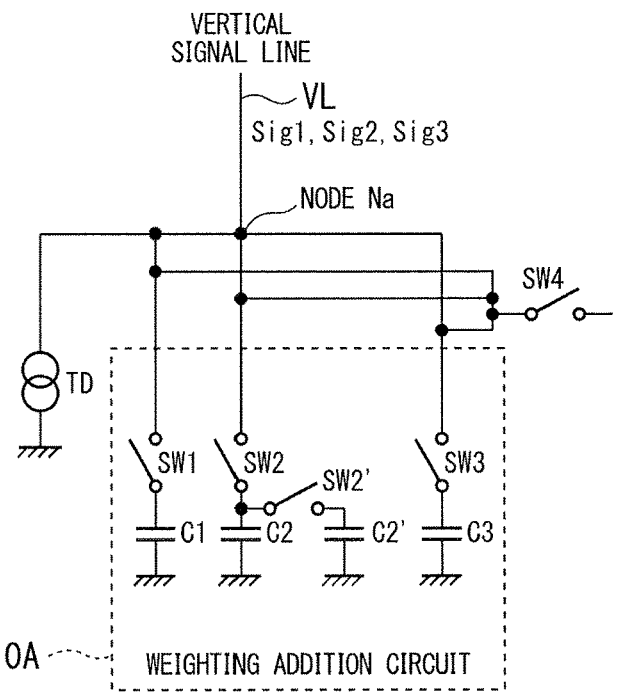
FIG. 16A is a diagram showing a modified example of the fifth embodiment.

With such a configuration, it is possible to perform averaging between the pixel signals Sig1, Sig2, and Sig3 by controlling, for example, the switch SW2 to be in an OFF state at all times. In addition, as shown in FIG. 16A, a configuration may be adopted in which one end of the switch SW2' connected to the capacitor C2' is connected to a connection point between the capacitor C2 and the switch SW1.

In addition, the number of capacitors connected to the respective switches SW1, SW2, and SW3 can be arbitrarily set. For example, it is possible to set the ratio between weighting values for the pixel signals Sig1, Sig2, and Sig3 to "1:2:3" by connecting one capacitor and the switch SW1, connecting two capacitors and the switch SW2, and connecting three capacitors and the switch SW3.

Figure 16B:
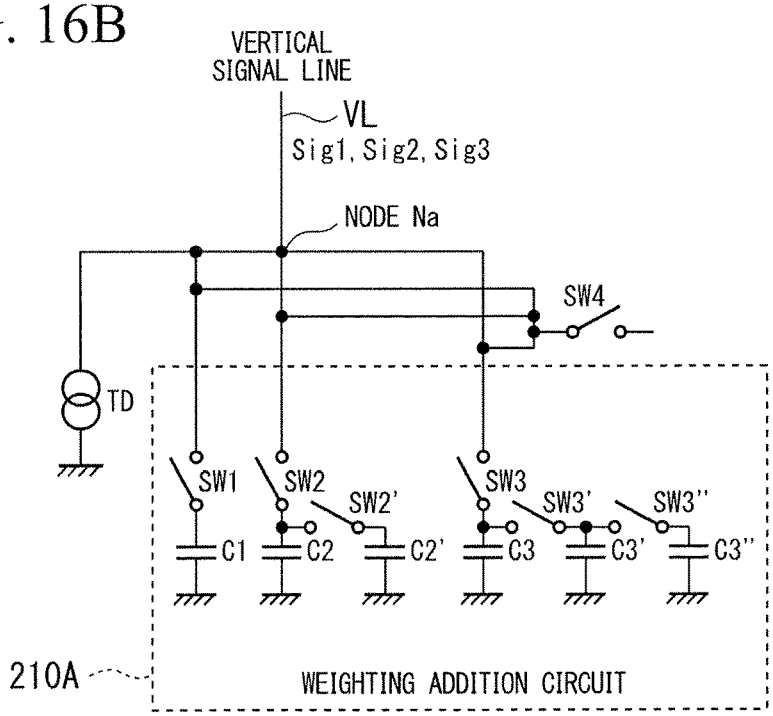
FIG. 16B is a diagram showing another modified example of the fifth embodiment.

In addition, when a plurality of capacitors are connected to each of the switches SW1, SW2, and SW3, each capacitor may be provided with a switch. For example, as shown in FIG. 16B, when two of the capacitors C2 and C2' are connected to the switch SW2, the switch SW2' is provided with respect to the capacitor C2'. When three capacitors C3, C3', and C3" are connected to the switch SW3, switches SW3' and SW3" may be provided with respect to the capacitors C3' and C3", respectively. In the example shown in FIG. 16B, it is possible to appropriately change the ratio between weighting values by controlling the turn-on and turn-off of the switches SW2', SW3', and SW3" provided in the respective capacitors C2', C3', and C3".

In addition, the number of switches SW1, SW2, and SW3 is not limited to three, and may be, for example, five or seven (basically, an odd number). It is possible to perform weighting addition at a desired ratio by setting the number of capacitors connected to the respective switches. That is, in the weighting addition circuit 210A, a switch is provided with respect to each of any number of capacitors, and thus it is possible to set any weighting with respect to any number of pixel signals.

Sixth Embodiment

In the weighting addition circuit 210 according to the fourth embodiment described above and the weighting addition circuit 210A according to the fifth embodiment described above, a description has been given of an example in which the weighting addition circuit is connected to the node Na which is a signal connection point between the vertical signal line VL and the PGA 11. However, the present invention is not limited thereto, and the weighting addition circuit may be disposed on the output side of the PGA 11.

Figure 17:
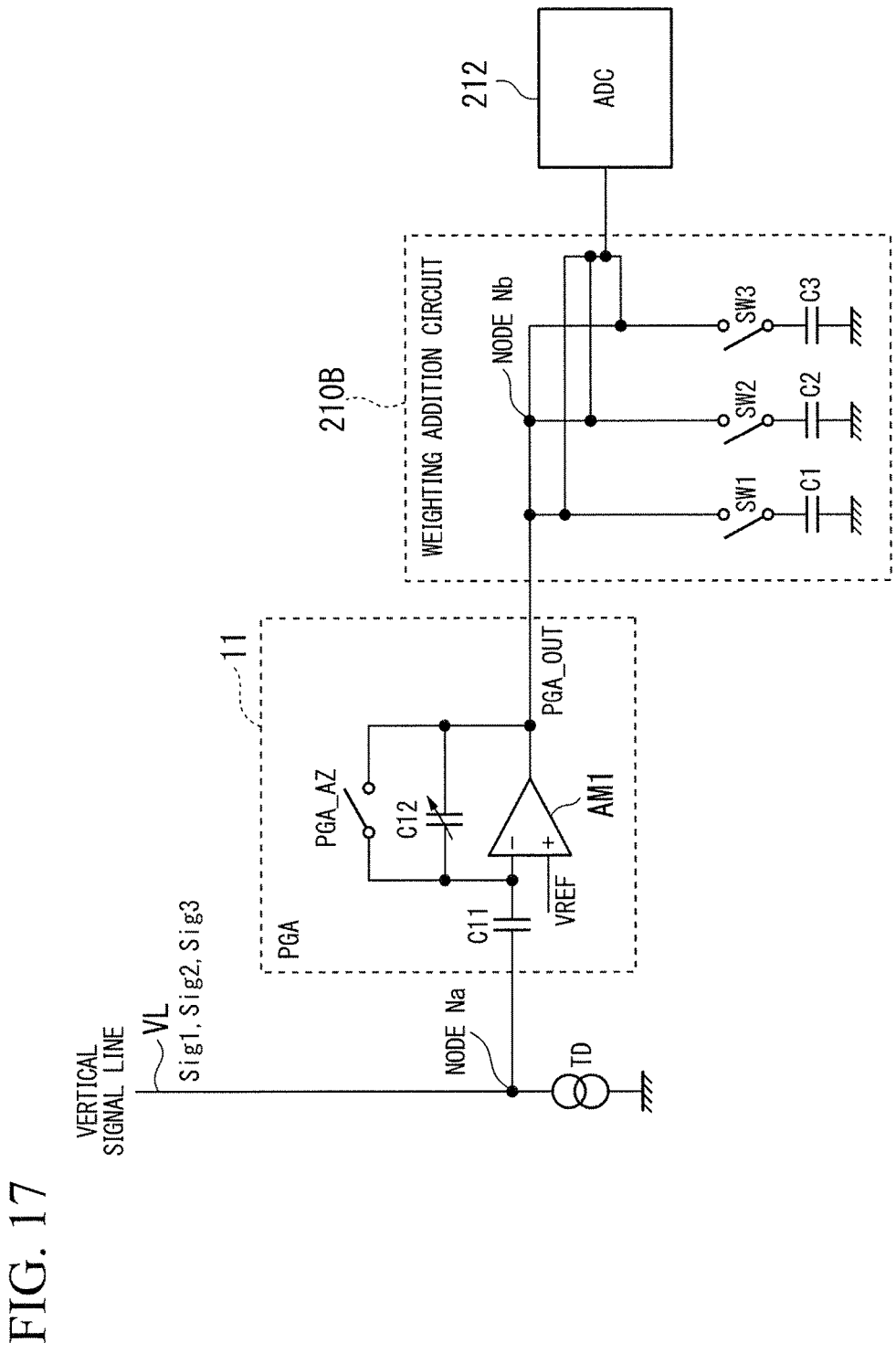
FIG. 17 is a diagram showing the configuration of a solid-state image pickup apparatus according to a sixth embodiment of the present invention.

FIG. 17 is a diagram showing the configuration of a weighting addition circuit 210B according to a sixth embodiment of the present invention. The weighting addition circuit 210B shown in FIG. 17 has the same configuration as that of the weighting addition circuit 210 shown in FIG. 12, and a difference is only in that the weighting addition circuit 210B is connected to a node Nb on the output side of a PGA 11.

That is, in the weighting addition circuit 210 shown in FIG. 12, weighting addition is performed on signals output from the vertical signal line VL. On the other hand, in the weighting addition circuit 210B shown in FIG. 17, weighting addition is performed on an output signal PGA_out of the PGA 11. Meanwhile, the operation of the weighting addition circuit 210B shown in FIG. 17 is the same as that of the weighting addition circuit 210 shown in FIG. 12, and thus a repeated description will be omitted here.

As described above, the embodiments of the present invention have been described, but a correspondence relation between the present invention and the embodiments will be supportively described.

In the above-described embodiments, a solid-state image pickup apparatus according to an aspect of the present invention corresponds to the solid-state image pickup apparatus 201, and a light-receiving pixel according to an aspect of the present invention corresponds to the pixel PX shown in FIGS. 1 and 2. In addition, a synthesis unit according to an aspect of the present invention corresponds to the weighting addition circuit 210, and an amplifier according to an aspect of the present invention corresponds to the PGA 11. In addition, a capacitive element according to an aspect of the present invention corresponds to the capacitors C1, C2, and C3, a first switch according to an aspect of the present invention corresponds to the switches SW1, SW2, and SW3, and a second switch according to an aspect of the present invention corresponds to the switch SW4.

In addition, a pixel signal holding unit according to an aspect of the present invention corresponds to the pixel signal holding unit 222, the switches SW1, SW2, and SW3 controlled by the pixel signal holding unit 222, and the capacitors C1, C2, and C3 (collectively referred to as "pixel signal holding unit 222").

In addition, the pixel signal synthesis unit according to an aspect of the present invention corresponds to the pixel signal synthesis unit 223, the switches SW1, SW2, and SW3 controlled by the pixel signal synthesis unit 223, and the capacitors C1, C2, and C3 (collectively referred to as "pixel signal synthesis unit 223").

(1) In the above-described embodiments, the solid-state image pickup apparatus 201 includes the vertical signal line VL that outputs pixel signals of selected rows for each column among a plurality of light-receiving pixels PX disposed in the form of a plurality of matrices, the weighting addition circuit 210 that temporarily holds the pixel signals output from the vertical signal line VL in units of the predetermined number of pixel signals and synthesizes and outputs one pixel signal from the plurality of held pixel signals Sig1, Sig2, Sig3, and the PGA 11 that amplifies the synthesized pixel signals output from the weighting addition circuit 210.

In the solid-state image pickup apparatus 201 having such a configuration, the weighting addition circuit 210 is disposed between the vertical signal line VL of the solid-state image pickup apparatus 201 and the PGA 11 that amplifies the pixel signals. The weighting addition circuit 210 temporarily holds the plurality of pixel signals Sig1, Sig2, and Sig3 that are sequentially output from the vertical signal line VL, synthesizes one pixel signal from the plurality of held pixel signals Sig1, Sig2, and Sig3, and outputs the synthesized pixel signal from the PGA 11.

Thus, when weighting addition is performed on the plurality of pixel signals Sig1, Sig2, and Sig3 output from the vertical signal line VL of the solid-state image pickup apparatus 201, it is possible to perform the weighting addition without including an error (error caused by noise and a response lag) which occurs at the time of amplifying the pixel signals using the PGA 11 and an error (a conversion error and a quantization error due to noise) which occurs at the time of performing A/D conversion on the pixel signals.

(2) In the above-described embodiments, the weighting addition circuit 210 includes a plurality of capacitors C1, C2, and C3, which are capacitive elements provided corresponding to a predetermined number of pixel signals Sig1, Sig2, and Sig3, which hold the respective pixel signals Sig1, Sig2, and Sig3, the pixel signal holding unit 222 that holds pixel signals of a predetermined number of selected rows among light-receiving pixels PX disposed in a matrix by holding the predetermined number of pixel signals Sig1, Sig2, and Sig3 in the respective capacitors C1, C2, and C3, and the pixel signal synthesis unit 223 that synthesizes the respective pixel signals Sig1, Sig2, and Sig3 held in the plurality of capacitors C1, C2, and C3 into one pixel signal.

The solid-state image pickup apparatus 201 having such a configuration includes the weighting addition circuit 210. The weighting addition circuit 210 controls turn-on and turn-off of the switches SW1, SW2, and SW3 using the pixel signal holding unit 222 when each of the pixel signals Sig1, Sig2, and Sig3 is output from the vertical signal line VL, and holds the pixel signals Sig1, Sig2, and Sig3 in the corresponding capacitors C1, C2, and C3. After the pixel signals Sig1, Sig2, and Sig3 are held in the respective capacitors C1, C2, and C3, the switches SW1, SW2, and SW3 are collectively turned on by the pixel signal synthesis unit 223. Thus, the pixel signals Sig1, Sig2, and Sig3 held in the respective plurality of capacitors C1, C2, and C3 are synthesized into one pixel signal.

Thus, when weighting addition is performed on the plurality of pixel signals Sig1, Sig2, and Sig3 output from the vertical signal line VL of the solid-state image pickup apparatus 201, it is possible to perform the weighting addition on the pixel signals Sig1, Sig2, and Sig3 by using analog signals on an output point (node Na) of the vertical signal line VL by a simple method using the capacitors C1, C2, and C3. For this reason, it is possible to perform the weighting addition without including an error occurring at the time of amplifying the pixel signals using the PGA 11 and an error occurring at the time of performing A/D conversion on the pixel signals.

(3) In the above-described embodiments, the weighting addition circuit 210 includes the plurality of capacitors C1, C2, and C3, which are capacitors C1, C2, and C3 provided corresponding to a predetermined number of pixel signals Sig1, Sig2, and Sig3, of which the capacitances are set in accordance with the ratio between weighting values of the pixel signals Sig1, Sig2, and Sig3. The pixel signal holding unit 222 holds the pixel signals Sig1, Sig2, and Sig3 by charging the capacitors C1, C2, and C3 corresponding to the pixel signals. The pixel signal synthesis unit 223 performs weighting addition on the plurality of pixel signals Sig1, Sig2, and Sig3 by redistributing the electrical charges held in the plurality of capacitors C1, C2, and C3 in the plurality of capacitors C1, C2, and C3 after all the pixel signals Sig1, Sig2, and Sig3 are held by the capacitors C1, C2, and C3 corresponding to the pixel signals.

Thus, the capacitance of each of the capacitors C1, C2, and C3 is set to a desired value, and thus it is possible to set the ratio between weighting values for the pixel signals Sig1, Sig2, and Sig3 to a desired value.

(4) In the above-described embodiments, the weighting addition circuit 210 includes the plurality of capacitors C1, C2, C2', and C3 having the same value of capacitance. The pixel signal holding unit 222 allocates one or a plurality of capacitors among the plurality of capacitors C1, C2, C2', and C3 with respect to the pixel signals Sig1, Sig2, and Sig3 in accordance with the ratio between weighting values of the pixel signals, and holds the pixel signals Sig1, Sig2, and Sig3 by charging the capacitors allocated to the pixel signals. The pixel signal synthesis unit 223 performs weighting addition on the plurality of pixel signals Sig1, Sig2, and Sig3 by redistributing the electrical charges held in the plurality of capacitors C1, C2, C2', and C3 in the plurality of capacitors C1, C2, C2', and C3 after all the pixel signals Sig1, Sig2, and Sig3 are held by the capacitors allocated to the pixel signals.

As shown in FIGS. 15A and 15B, in the solid-state image pickup apparatus 201 having such a configuration, the capacitances of the plurality of capacitors C1, C2, C2', and C3 are set to the same value, and one or a plurality of capacitors, among the plurality of capacitors C1, C2, C2', and C3, are allocated to the pixel signals Sig1, Sig2, and Sig3 in accordance with the ratio between weighting values of the pixel signals Sig1, Sig2, and Sig3. The pixel signals are held by charging one or a plurality of capacitors, which are allocated to the pixel signals, by the pixel signals Sig1, Sig2, and Sig3. Then, weighting addition is performed on the pixel signals Sig1, Sig2, and Sig3 by adding up the electrical charges held in the capacitors C1, C2, C2', and C3 in the capacitors C1, C2, C2', and C3 after the holding of the pixel signals Sig1, Sig2, and Sig3 using the capacitors is entirely completed.

Thus, it is possible to perform weighting addition on the pixel signals Sig1, Sig2, and Sig3 using the capacitors C1, C2, C2', and C3 having the same capacitance.

(5) In the above-described embodiments, the predetermined number of pixel signals is the odd number of three or more (for example, three or five) pixel signals of the same color.

Thus, it is possible to perform weighting addition on an odd number of pixel signals, such as three or five pixel signals of the same color, using analog signals on an output point (node Na) of the vertical signal line VL.

(6) In the above-described embodiments, the ratio between weighting values for the predetermined number of pixel signals Sig1, Sig2, and Sig3 is set in such a manner that the weighting value for the middle pixel signal among the plurality of pixel signals, which are sequentially held in the capacitors C1, C2, and C3, is the largest value.

Thus, it is possible to improve a dynamic range by emphasizing pixel information of the central pixel signal Sig2 and by performing weighting addition on the pixel signals Sig1 and Sig2 in the vicinity of the central pixel signal.

(7) In the above-described embodiments, the weighting addition circuit 210 includes the switches SW1, SW2, and SW3 that selectively connect the node Na on the signal output side of the vertical signal line VL and the plurality of capacitors C1, C2, and C3. The pixel signal holding unit 222 connects the capacitors corresponding to the pixel signals Sig1, Sig2, and Sig3 and the node Na using the switches SW1, SW2, and SW3 at the time of holding the pixel signals, and charges the capacitors C1, C2, and C3 corresponding to the pixel signals, using the pixel signals. The pixel signal synthesis unit 223 collectively turns on the switches SW1, SW2, and SW3, which connect the plurality of capacitors C1, C2, and C3 and the node Na, at the time of synthesizing the pixel signals Sig1, Sig2, and Sig3, and thus generates pixel signals having been subjected to weighting addition on the node Na using the electrical charges charged into the plurality of capacitors C1, C2, and C3.

In the solid-state image pickup apparatus 201 having such a configuration, the switch SW1 is turned on when the pixel signal Sig1 is output to the vertical signal line VL so that the capacitor C1 is charged by the pixel signal Sig1, and thus the pixel signal Sig1 is held in the capacitor C1. In addition, the switch SW2 is turned on when the pixel signal Sig2 is output to the vertical signal line VL so that the capacitor C2 is charged by the pixel signal Sig2, and thus the pixel signal Sig2 is held in the capacitor C2. In addition, the switch SW3 is turned on when the pixel signal Sig3 is output to the vertical signal line VL so that the capacitor C3 is charged by the pixel signal Sig3, and thus the pixel signal Sig3 is held in the capacitor C3. After the pixel signals Sig1, Sig2, and Sig3 are held in the respective capacitors C1, C2, and C3, the switches SW1, SW2, and SW3 connecting the capacitors C1, C2, and C3 and the node Na are collectively turned on, and thus pixel signals having been subjected to weighting addition are generated on the node Na using the electrical charges charged into the capacitors C1, C2, and C3.

Accordingly, the turn-on and turn-off of the switches SW1, SW2, and SW3 are controlled, and thus it is possible to hold the pixel signals Sig1, Sig2, and Sig3 output from the vertical signal line VL in the capacitors C1, C2, and C3 corresponding to the pixel signals. In addition, the turn-on and turn-off of the switches SW1, SW2, and SW3 are controlled, and thus it is possible to add up the electrical charges charged in the capacitors C1, C2, and C3 and to generate pixel signals having been subjected to weighting addition on the node Na.

(8) In the above-described embodiments, the weighting addition circuit 210 includes switch SW4 that selectively connects the node Na and the PGA 11. The pixel signal holding unit 222 turns on the switches SW1, SW2, and SW3 corresponding to the predetermined number of pixel signals Sig1, Sig2, and Sig3 when the pixel signals are output from the vertical signal line VL, and charges the capacitors C1, C2, and C3 corresponding to the pixel signals, using the pixel signals. The pixel signal synthesis unit 223 collectively turns on the switches SW1, SW2, and SW3, which connect the plurality of capacitors C1, C2, and C3 and the node Na, after the charge of the capacitors C1, C2, and C3 using the predetermined number of pixel signals Sig1, Sig2, and Sig3 is entirely completed so that pixel signals having been subjected to weighting addition are generated on the node Na using the electrical charges charged into the plurality of capacitors C1, C2, and C3, and turns on the switch SW4 connecting the node Na and the PGA 11 after the pixel signals having been subjected to weighting addition are generated on the node Na so that the pixel signals having been subjected to weighting addition are output toward the PGA 11.

In the solid-state image pickup apparatus 201 having such a configuration, when the plurality of pixel signals Sig1, Sig2, and Sig3 are output from the vertical signal line VL, switches corresponding to the pixel signals are turned on, and thus the capacitors corresponding to the pixel signals are charged using the pixel signals. After the charge of the capacitors C1, C2, and C3 using the plurality of pixel signals Sig1, Sig2, and Sig3 is entirely completed, the switches SW1, SW2, and SW3 are collectively turned on, and thus the electrical charges charged into the capacitors C1, C2, and C3 are added up (more accurately, the electrical charges are redistributed on the capacitors C1, C2, and C3), thereby generating pixel signals having been subjected to weighting addition on the node Na. After the pixel signals having been subjected to weighting addition are generated on the node Na, the switch SW4 connecting the node Na and the PGA 11 is turned on, and thus the pixel signals having been subjected to weighting addition are output toward the PGA 11.

Thus, after weighting addition is performed on the plurality of pixel signals Sig1, Sig2, and Sig3, which are output from the vertical signal line VL of the solid-state image pickup apparatus 201, on an output point (node Na) of the vertical signal line VL, it is possible to output the pixel signals having been subjected to weighting addition toward the PGA 11. For this reason, when the weighting addition circuit 210 performs a weighting addition process, the circuit is not influenced by the PGA 11. In addition, it is possible to prevent unnecessary signals from being output from the PGA 11 during the weighting addition process.

As described above, the embodiments of the present invention have been described. However, a solid-state image pickup apparatus of the present invention is not limited to only the above-described examples shown in the drawings, and various modifications can be made without departing from the scope of the invention. The requirements of the above-described embodiments can be appropriately combined. In addition, some components may not be used.

DESCRIPTION OF THE REFERENCE SYMBOLS 1, 201 Solid-state image pickup apparatus
2 Pixel unit
3 Vertical scanning circuit
4 Horizontal scanning circuit
11 PGA
12, 212 ADC (A/D conversion circuit)
21 Control unit
22 Coarse conversion control unit
23 Fine conversion control unit
24 Counter
C1 to C8 Capacitor
C10, C11, C12 Capacitor
CP1 Comparator
PX, R1, R2, R3 Pixel
S1a, S4b to S8a, S8b, SX Switch
S9, S10, S11, S12, S13 Switch
Sig1, Sig2, Sig3 Pixel signal
Vcm, Na Node
210, 210A, 210B Weighting addition circuit
220 Weighting addition control unit
221 Pixel signal holding unit
222 Pixel signal synthesis unit

The invention claimed is:
1. An image sensor comprising:
a first pixel that generates a first signal by an electric charge converted through photoelectric conversion;
a second pixel that is in a different position from the first pixel and generates a second signal by an electric charge converted through photoelectric conversion;
a signal line that is connected to the first pixel and the second pixel and outputs the first signal generated by the first pixel and the second signal generated by the second pixel;
a signal processing portion that generates a third signal by adding the first signal output to the signal line from the first pixel and the second signal output to the signal line from the second pixel; and
a comparator that compares the third signal generated by the signal processing portion with a reference signal.
2. The image sensor according to claim 1, wherein
the signal processing portion has a first holding portion which holds the first signal and a second holding portion which holds the second signal, and
the third signal is generated by the first signal held by the first holding portion and the second signal held by the second holding portion.

3. The image sensor according to claim 2, wherein
a capacitance of the first holding portion is different from a capacitance of the second holding portion.
4. The image sensor according to claim 2, further comprising:
a third pixel that generates a fourth signal by an electric charge converted through photoelectric conversion, wherein
the signal line outputs the fourth signal generated by the third pixel,
the signal processing portion has a third holding portion which holds the fourth signal output to the signal line from the third pixel, and
the third signal is generated by the first signal held by the first holding portion, the second signal held by the second holding portion, and the fourth signal held by the third holding portion.
5. The image sensor according to claim 1, further comprising:
an amplifying portion that amplifies the first signal output to the signal line from the first pixel and the second signal output to the signal line from the second pixel, wherein
the signal processing portion is disposed between the amplifying portion and the comparator, and
the third signal is generated by the first signal amplified by the amplifying portion and the second signal amplified by the amplifying portion.
6. An image sensor comprising:
a first pixel that generates a first signal by an electric charge converted through photoelectric conversion;
a second pixel that is in a different position from the first pixel and generates a second signal by an electric charge converted through photoelectric conversion;
a signal line that is connected to the first pixel and the second pixel and outputs the first signal generated by the first pixel and the second signal generated by the second pixel;
a signal processing portion that generates a third signal by adding the first signal output to the signal line from the first pixel and the second signal output to the signal line from the second pixel; and
an amplifying portion that amplifies the third signal generated by the signal processing portion.
7. The image sensor according to claim 6, wherein
the signal processing portion has a first holding portion which holds the first signal and a second holding portion which holds the second signal, and
the third signal is generated by the first signal held by the first holding portion and the second signal held by the second holding portion.
8. The image sensor according to claim 7, wherein
a capacitance of the first holding portion is different from a capacitance of the second holding portion.
9. The image sensor according to claim 6, further comprising:
a converting portion that converts the third signal amplified by the amplifying portion into a digital signal.
10. The image sensor according to claim 7, further comprising:
a third pixel that generates a fourth signal by an electric charge converted through photoelectric conversion, wherein
the signal line outputs the fourth signal generated by the third pixel, the signal processing portion has a third holding portion which holds the fourth signal output to the signal line from the third pixel, and the third signal is generated by the first signal held by the first holding portion, the second signal held by the second holding portion, and the fourth signal held by the third holding portion.

11. The image sensor according to claim 1,
wherein the first pixel has a first photoelectric converting portion that converts a light into an electrical charge, and
wherein the second pixel has a second photoelectric converting portion that is different from the first photoelectric converting portion and converts a light into an electrical charge.

12. The image sensor according to claim 2,
wherein the first holding portion has a first capacitive element that holds the first signal output to the signal line from the first pixel, and
wherein the second holding portion has a second capacitive element that is different from the first capacitive element and holds the second signal output to the signal line from the second pixel.

13. The image sensor according to claim 4,
wherein the first holding portion has a first capacitive element that holds the first signal output to the signal line from the first pixel,
wherein the second holding portion has a second capacitive element that is different from the first capacitive element and holds the second signal output to the signal line from the second pixel,
wherein the third holding portion has a third capacitive element that is different from the first capacitive element and the second capacitive element and holds the fourth signal output to the signal line from the third pixel, and
wherein the third signal is generated by the first signal held by the first capacitive element, the second signal held by the second capacitive element, and the fourth signal held by the third capacitive element.

14. The image sensor according to claim 13,
wherein the second pixel is disposed between the first pixel and the third pixel in the signal line, and
wherein a capacitance of the second capacitive element is different from a capacitance of the first capacitive element and a capacitance of the third capacitive element.

15. The image sensor according to claim 1,
wherein the comparator configures a converting portion that converts the third signal to a digital signal.

16. The image sensor according to claim 6,
wherein the first pixel has a first photoelectric converting portion that converts a light into an electrical charge, and
wherein the second pixel has a second photoelectric converting portion that is different from the first photoelectric converting portion and converts a light into an electrical charge.

17. The image sensor according to claim 7,
wherein the first holding portion has a first capacitive element that holds the first signal output to the signal line from the first pixel, and
wherein the second holding portion has a second capacitive element that is different from the first capacitive element and holds the second signal output to the signal line from the second pixel.

18. The image sensor according to claim 10,
wherein the first holding portion has a first capacitive element that holds the first signal output to the signal line from the first pixel,
wherein the second holding portion has a second capacitive element that is different from the first capacitive element and holds the second signal output to the signal line from the second pixel,
wherein the third holding portion has a third capacitive element that is different from the first capacitive element and the second capacitive element and holds the fourth signal output to the signal line from the third pixel, and
wherein the third signal is generated by the first signal held by the first capacitive element, the second signal held by the second capacitive element, and the fourth signal held by the third capacitive element.

19. The image sensor according to claim 18,
wherein the second pixel is disposed between the first pixel and the third pixel in the signal line, and
wherein a capacitance of the second capacitive element is different from a capacitance of the first capacitive element and a capacitance of the third capacitive element.

20. The image sensor according to claim 9,
wherein the converting portion has a comparator that compares the third signal with a reference signal.

21. An image sensor comprising:
a first photoelectric converting portion that converts a light into an electrical charge;
a second photoelectric converting portion that is in a different position from the first photoelectric converting portion and converts a light to an electrical charge;
a signal line that outputs a first signal generated by the electrical charge converted by the first photoelectric converting portion and a second signal generated by the electrical charge converted by the second photoelectric converting portion;
a signal processing portion that generates a third signal by adding the first signal output to the signal line and the second signal output to the signal line; and
a comparator that converts the third signal generated by the signal processing portion into a digital signal.

22. The image sensor according to claim 21,
wherein the signal processing portion has a holding portion that holds the first signal output to the signal line and the second signal output to the signal line, and
wherein the third signal is generated by the first signal held by the holding portion and the second signal held by the holding portion.

23. The image sensor according to claim 22,
wherein the holding portion has a first capacitive element that holds the first signal output to the signal line and a second capacitive element that is different from the first capacitive element and holds the second signal output to the signal line, and
wherein the third signal is generated by the first signal held by the first capacitive element and the second signal held by the second capacitive element.

24. The image sensor according to claim 23,
wherein the signal processing portion has
a first connecting portion that connects between the signal line and the first capacitive element to cause the first capacitive element to hold the first signal,
a second connecting portion that is different from the first connecting portion and connects between the signal line and the second capacitive element to cause the second capacitive element to hold the second signal, and a third connecting portion that connects the first capacitive element, the second capacitive element and the comparator to input the third signal to the comparator.

25. The image sensor according to claim 23,
wherein a capacitance of the first capacitive element is different from a capacitance of the second capacitive element.

26. An image sensor comprising:
a first photoelectric converting portion that converts a light into an electrical charge;
a second photoelectric converting portion that is in a different position from the first photoelectric converting portion and converts a light to an electrical charge;
a signal line that outputs a first signal generated by the electrical charge converted by the first photoelectric converting portion and a second signal generated by the electrical charge converted by the second photoelectric converting portion;
a signal processing portion that generates a third signal by adding the first signal output to the signal line and the second signal output to the signal line; and
an amplifying portion that amplifies the third signal generated by the signal processing portion.

27. The image sensor according to claim 26,
wherein the signal processing portion has a holding portion that holds the first signal output to the signal line and the second signal output to the signal line, and
wherein the third signal is generated by the first signal held by the holding portion and the second signal held by the holding portion.

28. The image sensor according to claim 27,
wherein the holding portion has a first capacitive element that holds the first signal output to the signal line and a second capacitive element that is different from the first capacitive element and holds the second signal output to the signal line, and
wherein the third signal is generated by the first signal held by the first capacitive element and the second signal held by the second capacitive element.

29. The image sensor according to claim 28,
wherein the signal processing portion has
a first connecting portion that connects between the signal line and the first capacitive element to cause the first capacitive element to hold the first signal,
a second connecting portion that is different from the first connecting portion and connects between the signal line and the second capacitive element to cause the second capacitive element to hold the second signal, and
a third connecting portion that connects the first capacitive element, the second capacitive element and the amplifying portion to input the third signal to the amplifying portion.

30. The image sensor according to claim 28,
wherein a capacitance of the first capacitive element is different from a capacitance of the second capacitive element.

31. An image sensor comprising:
a first photoelectric converting portion that converts a light into an electrical charge;
a second photoelectric converting portion that is in a different position from the first photoelectric converting portion and converts a light to an electrical charge;
a third photoelectric converting portion that is in a different position from the first photoelectric converting portion and the second photoelectric converting portion and converts a light to an electrical charge;
a signal line that outputs a first signal generated by the electrical charge converted by the first photoelectric converting portion, a second signal generated by the electrical charge converted by the second photoelectric converting portion, and a third signal generated by the electrical charge converted by the third photoelectric converting portion;
a signal processing circuit that generates a fourth signal by adding the first signal output to the signal line, the second signal output to the signal line, and the third signal output to the signal line; and
a comparator that converts the fourth signal generated by the signal processing portion into a digital signal.

32. The image sensor according to claim 31,
wherein the signal processing portion has a holding portion that holds the first signal output to the signal line, the second signal output to the signal line, and the third signal output to the signal line, and
wherein the fourth signal is generated by the first signal held by the holding portion, the second signal held by the holding portion, and the third signal held by the holding portion.

33. The image sensor according to claim 32,
wherein the holding portion has
a first capacitive element that holds the first signal output to the signal line,
a second capacitive element that is different from the first capacitive element and holds the second signal output to the signal line, and
a third capacitive element that is different from the first capacitive element and the second capacitive element and holds the third signal output to the signal line, and
wherein the fourth signal is generated by the first signal held by the first capacitive element, the second signal held by the second capacitive element, and the third signal held by the third capacitive element.

34. The image sensor according to claim 33,
wherein the signal processing portion has
a first connecting portion that connects between the signal line and the first capacitive element to cause the first capacitive element to hold the first signal,
a second connecting portion that is different from the first connecting portion and connects between the signal line and the second capacitive element to cause the second capacitive element to hold the second signal,
a third connecting portion that is different from the first connecting portion and the second connecting portion and connects between the signal line and the third capacitive element to cause the third capacitive element to hold the third signal, and
a fourth connecting portion that connects the first capacitive element, the second capacitive element, the third capacitive element and the comparator to input the fourth signal to the comparator.

35. The image sensor according to claim 33,
wherein the second photoelectric converting portion is disposed between the first photoelectric converting portion and the third photoelectric converting portion in the signal line, and
wherein a capacitance of the second capacitive element is different from a capacitance of the first capacitive element and a capacitance of the third capacitive element.

36. The image sensor according to claim 1, wherein the first and second pixels are not adjacent pixels.

* * * * *